US011854775B2

(12) United States Patent
Grotjohn et al.

(10) Patent No.: US 11,854,775 B2
(45) Date of Patent: Dec. 26, 2023

(54) METHODS AND APPARATUS FOR MICROWAVE PLASMA ASSISTED CHEMICAL VAPOR DEPOSITION REACTORS

(71) Applicant: BOARD OF TRUSTEES OF MICHIGAN STATE UNIVERSITY, East Lansing, MI (US)

(72) Inventors: Timothy A. Grotjohn, Okemos, MI (US); Jes Asmussen, East Lansing, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 681 days.

(21) Appl. No.: 16/744,830

(22) Filed: Jan. 16, 2020

(65) Prior Publication Data

US 2020/0152433 A1 May 14, 2020

Related U.S. Application Data

(62) Division of application No. 15/463,046, filed on Mar. 20, 2017, now Pat. No. 10,541,118.

(Continued)

(51) Int. Cl.
*H01J 37/32* (2006.01)
*C23C 16/511* (2006.01)
(Continued)

(52) U.S. Cl.
CPC ..... *H01J 37/3299* (2013.01); *H01J 37/32311* (2013.01); *H01J 37/32926* (2013.01);
(Continued)

(58) Field of Classification Search
CPC .......................... H01J 37/32082–32311; H01J 37/32917–3299; H01J 37/32458;
(Continued)

(56) References Cited

U.S. PATENT DOCUMENTS 4,479,848 A * 10/1984 Otsubo ................. H01L 21/302
216/60
4,711,790 A * 12/1987 Morishige ............. C23C 16/483
427/586

(Continued)

FOREIGN PATENT DOCUMENTS

WO WO-2012/158532 A1 11/2012

OTHER PUBLICATIONS

Hilfiker et al., "In Situ Characterization of Thin Film Growth," Woodhead Publishing Series in Electronic and Optical Materials, pp. 99-151 (2011).

*Primary Examiner* — Benjamin Kendall
*Assistant Examiner* — Kurt Sweely
(74) *Attorney, Agent, or Firm* — MARSHALL, GERSTEIN & BORUN LLP

(57) ABSTRACT

The disclosure relates to microwave cavity plasma reactor (MCPR) apparatus and associated optical measurement system that enable microwave plasma assisted chemical vapor deposition (MPACVD) of a component such as diamond while measuring the local surface properties of the component while being grown. Related methods include deposition of the component, measurement of the local surface properties, and/or alteration of operating conditions during deposition in response to the local surface properties. As described in more detail below, the MPCR apparatus includes one or more electrically conductive, optically transparent regions forming part of the external boundary of its microwave chamber, thus permitting external optical interrogation of internal reactor conditions during deposition while providing a desired electrical microwave chamber to maintain selected microwave excitation modes therein.

21 Claims, 14 Drawing Sheets

Related U.S. Application Data

(60) Provisional application No. 62/310,938, filed on Mar. 21, 2016.

(51) Int. Cl.
*C23C 16/27* (2006.01)
*C23C 16/52* (2006.01)

(52) U.S. Cl.
CPC ...... *H01J 37/32935* (2013.01); *C23C 16/274* (2013.01); *C23C 16/511* (2013.01); *C23C 16/52* (2013.01); *H01J 37/32192* (2013.01); *H01J 37/32229* (2013.01); *H01J 37/32238* (2013.01); *H01J 37/32458* (2013.01); *H01J 37/32715* (2013.01); *H01J 37/32972* (2013.01)

(58) Field of Classification Search
CPC ....... H01J 37/32715; C23C 16/27–279; C23C 16/453; C23C 16/48–488; C23C 16/511; C23C 16/52; H01L 21/67069; H01L 21/67253–67288; H01L 21/681; C30B 25/02–205

See application file for complete search history.

(56) References Cited

U.S. PATENT DOCUMENTS

| | | | | |
|---|---|---|---|---|
| 5,293,216 | A | * | 3/1994 | Moslehi ............... G03F 7/70483 356/600 |
| 5,311,103 | A | | 5/1994 | Asmussen et al. |
| 5,376,223 | A | * | 12/1994 | Salimian ........... H01L 21/31116 257/E21.252 |
| 5,397,428 | A | * | 3/1995 | Stoner .................... C23C 16/02 117/103 |
| 8,316,797 | B2 | | 11/2012 | Asmussen et al. |
| 8,668,962 | B2 | | 3/2014 | Asmussen et al. |
| 10,541,118 | B2 | | 1/2020 | Grotjohn et al. |
| 2002/0008088 | A1 | * | 1/2002 | Suzuki ............. H01J 37/32238 219/121.41 |
| 2004/0107910 | A1 | * | 6/2004 | Nakata ............. H01J 37/32192 118/723 MW |
| 2005/0257891 | A1 | * | 11/2005 | Goto .................... C23C 16/511 118/723 MW |
| 2010/0034984 | A1 | | 2/2010 | Asmussen et al. |
| 2013/0069531 | A1 | * | 3/2013 | Asmussen ............ C23C 16/511 315/111.21 |
| 2014/0220261 | A1 | | 8/2014 | Asmussen et al. |
| 2015/0318185 | A1 | * | 11/2015 | Kodaira .................. H01L 22/20 156/345.28 |
| 2016/0025656 | A1 | * | 1/2016 | Jevtic ...................... H01J 49/10 324/633 |
| 2016/0056361 | A1 | | 2/2016 | Darwish et al. |

* cited by examiner

METHODS AND APPARATUS FOR MICROWAVE PLASMA ASSISTED CHEMICAL VAPOR DEPOSITION REACTORS

CROSS REFERENCE TO RELATED APPLICATIONS

This application is a division of U.S. patent application Ser. No. 15/463,046 (filed Mar. 20, 2017), which claims the priority benefit of U.S. Provisional Application No. 62/310,938 filed Mar. 21, 2016, both of which are incorporated herein by reference in their entireties.

STATEMENT OF GOVERNMENT INTEREST

None.

FIELD OF THE DISCLOSURE

The disclosure relates to microwave cavity plasma reactor (MCPR) apparatus and associated optical measurement system that enable microwave plasma assisted chemical vapor deposition (MPACVD) of a component such as diamond while measuring the local surface properties of the component while being grown. Related methods include deposition of the component, measurement of the local surface properties, and/or alteration of operating conditions during deposition in response to the local surface properties.

BACKGROUND OF THE DISCLOSURE

During microwave plasma assisted chemical vapor deposition (MPACVD) of a component such as diamond, the top surface of a growth substrate upon with the component is being deposited does not necessarily maintain the same shape or surface characteristics during deposition. Some shapes or surface characteristics developed during deposition can be unfavorable. It would be desirable to have a real-time means for in situ measurement of the substrate shape and surface characteristics during deposition. It further would be desirable to identify from such measurements unfavorable substrate properties as they develop, thus permitting alteration of operating conditions during deposition to halt or correct unfavorable substrate property development.

SUMMARY

The growth of diamond and incorporation of impurities depend on a number of factors including substrate temperature, temperature distribution across the diamond substrate, methane concentration in the feedgas, impurity concentration in the feedgas, and the plasma species density arriving at the substrate (i.e., how close is the substrate to the hottest part of the plasma discharge). The diamond substrate evolves as the diamond growth process proceeds in number of possible ways. At the start of the process the deposition reactor is usually operated with just a hydrogen plasma discharge until the pressure and temperature of the substrate is up to the deposition temperature, then the methane flow is started. During this start-up phase the diamond surface is etched by the hydrogen discharge. This can be beneficial in that it cleans and helps remove any damage in the region near the surface. It can also be detrimental by forming etch pits in the surface of the diamond that may or may not grow out as defects in the deposited layer. Once the diamond is growing, the diamond may grow fastest at the substrate edges, it may grow fastest in the center, or if the diamond is prepared such that the top surface is not the (100) surface but rather at an offset, the growth may proceed from one edge to the opposite edge. Additionally the growth can proceed with a number of different surface topologies including smooth surface, terraced surface, a surface with pyramidal hillocks, or rounded hillocks as shown in FIG. 6. In general, the type of growth depends on the temperature distribution across the surface, the pre-growth preparation of the diamond substrate surface and the current state of the surface during growth. Having real-time information of the temperature distribution across the surface and the surface angle and morphology across the surface will allow more sophisticated real-time control of the diamond deposition process.

Disclosed herein is an optical measurement system 300 (FIG. 1A) to measure the surface of a substrate 163A during deposition of a component (e.g., diamond) in a microwave cavity plasma reactor (MCPR) apparatus 100 (FIGS. 1B and 1D). The optical measurement system 300 includes a laser or other coherent light source 310, optionally a steerable mirror or other means 320 for directing incident light to a desired spatial location on the substrate 163A, and focal plane array or other means 330 for detecting a spatial distribution of incident light energy. The system 300 is able to measure reflected light 316 and scattered light 318 from the substrate 163A resulting from an impinging coherent beam of incident light 314 from the coherent light source 310, all during deposition of the component in the reactor 100. The system 300 can monitor a number of quantities, including the angle of the top surface 163B versus spatial position of the substrate 163A as it evolves during diamond growth as well as the roughness and nature of the roughness (e.g., smooth, terraced, hillocks, defects) of the top surface 163B of the substrate 163A during diamond growth.

In the illustrative system 300 shown in FIG. 1A, the coherent laser light beam 314 is scanned across the diamond surface 163B and the reflected/scattered light 316, 318 is detected by a focal plane array 330 (or a camera directed at the image on a surface). In the illustrated embodiment, the laser 310 can be mounted in a fixed position, and the steerable mirror 320 can be used to reflect and direct an originally emitted laser beam 312 from the laser 310 as the incident coherent light beam 314 to the substrate 163A. In an embodiment, the laser spot size of the incident coherent light beam 314 on the upper diamond surface 163B can be about 1 mm in diameter. As a result, the information that is collected from the system 300 can have a spatial resolution of about 1 mm on the substrate 163A. The surface 163B data that can be collected includes the angle of the surface 163B, the roughness of the surface 163B, and the nature of the roughness of the surface 163B. Of particular significance is that this information is collected real-time during a diamond (or other component) deposition run and it can be used for feedback adjustment to the reactor 100 and deposition process to get specific results.

In one aspect, the disclosure relates to a microwave plasma assisted reactor comprising: (a) a first microwave chamber having an internal volume and comprising an electromagnetic wave source; (b) a plasma chamber having an outer wall and comprising an optical window forming at least a portion of the outer wall, the plasma chamber extending into the first microwave chamber; (c) a stage for supporting a substrate, the stage having a reference surface extending into the plasma chamber; (d) a first electrically conductive, optically transparent region forming at least a portion of the first microwave chamber external boundary;

and (e) a second electrically conductive, optically transparent region forming at least a portion of the first microwave chamber external boundary; wherein the first region and the second region are spatially positioned on the first microwave chamber external boundary such that, when a substrate is present on the stage reference surface, light from a coherent light source passing through the first region is in optical communication with the second region by (i) passing through the first region, (ii) passing through the optical window, (iii) reflecting off the substrate, (iv) passing through the optical window, and (v) passing through the second region.

Various refinements of the microwave plasma assisted reactor are possible. In a refinement, the first electrically conductive, optically transparent region comprises a first metallic screen, and the second electrically conductive, optically transparent region comprises a second metallic screen. In another refinement, the first electrically conductive, optically transparent region comprises a first electrically conducting optical window, and the second electrically conductive, optically transparent region comprises a second electrically conducting optical window. In another refinement, the first region and the second region are separate regions of the first microwave chamber external boundary. In another refinement, the first region and the second region are portions of the same region of the first microwave chamber external boundary. In another refinement, the first region and the second region are each positioned on an outer wall of the first microwave chamber.

In another refinement, the first microwave chamber further comprises an upper conducting short in electrical contact with an outer wall of the first microwave chamber and disposed in an upper portion of the first microwave chamber, the upper conducting short defining an upper boundary of the first microwave chamber. For example, the first region and the second region can be each positioned on the upper conducting short. Similarly, (i) the first region can be positioned on an outer wall of the first microwave chamber and (ii) the second region can be each positioned on the upper conducting short.

In another refinement, the optical window comprises two opposing flat external surfaces. In another refinement, (i) the optical window comprises a first optical window region and a second optical window region. (ii) the first optical window region is positioned such that coherent light passing through the first region and to the substrate, when present, also passes through the first optical window region, and (iii) the second optical window region is positioned such that light reflecting off the substrate, when present, and passing through the second region also passes through the second optical window.

In another refinement, (i) the first microwave chamber has a reference plane at a reference axial location $Z_0$, the first microwave chamber extends in an axial direction $z>Z_0$, and the upper conducting short is disposed in an upper portion of the first microwave chamber at an axial distance $L_s$ above $Z_0$, the upper conducting short having a central opening, (ii) the plasma chamber extends into the first microwave chamber such that at least a portion of the plasma chamber is located at $z>Z_0$, and (iii) the stage is a conductive stage and has an axially adjustable reference surface extending into the plasma chamber at an axial distance $Z_s$ relative to $Z_0$. For example, in a particular embodiment, the conductive stage defines a second microwave chamber in the plasma chamber (i) at $z<Z_0$ and (ii) between the plasma chamber outer wall and the conductive stage; the microwave plasma assisted reactor further comprises a conducting short adjustably disposed in the second microwave chamber below $Z_0$ and in electrical contact with the plasma chamber outer wall and the conductive stage, the axial distance between the conducting short and $Z_0$ being L2, and the axial distance between the conducting short and the reference surface of the conductive stage being L1; and L2 and L1 are capable of axial adjustment in the reactor by moving the conducting short during operation of the reactor.

In another aspect, the disclosure relates to a microwave plasma assisted reactor system comprising: (a) the microwave plasma assisted reactor according to any of the variously disclosed embodiments; (b) optionally, a steerable mirror positioned to receive an incident beam of coherent light external to the reactor and to direct a reflected beam of the coherent light through the first region and into the first microwave chamber internal volume; (c) a coherent light source positioned and adapted to direct the incident beam of coherent light through the first region and into the first microwave chamber internal volume; (d) a means for detecting a spatial distribution of incident light energy positioned to receive an incident distribution of light that has been reflected and/or scattered from the reflected beam of coherent light by a substrate present on the stage reference surface, when present; and (e) optionally a computer comprising a processor and memory coupled to a computer readable storage medium encoded with a computer program, the program comprising instructions that, when executed by the processor, cause the computer to control the steerable mirror, the coherent light source, and the focal plane array during operation of the microwave plasma assisted reactor. In a refinement, the steerable mirror is present and the coherent light source is positioned and adapted to direct the incident beam of coherent light to the steerable mirror, through the first region and into the first microwave chamber internal volume. In another refinement, the means for detecting a spatial distribution of incident light energy comprises a focal plane array.

In another aspect, the disclosure relates to a process for depositing a component on a substrate, the process comprising: (a) providing the microwave plasma assisted reactor system according to any of the various reactor and system embodiments disclosure herein, the reactor system further comprising a substrate; (b) operating the microwave plasma assisted reactor at a temperature and pressure sufficient to deposit a component on the substrate; (c) operating the coherent light source to direct an incident beam of coherent light through the first region and onto the substrate, thereby forming reflected and scattered light from the substrate; and (d) receiving at the means for detecting a spatial distribution of incident light energy an incident distribution of the reflected and scattered light from the substrate and passing through the second region.

Various refinements of the deposition process are possible. In a refinement, the process further comprises orienting the steerable mirror during deposition of the component to scan different regions of the substrate as a function of time during deposition. In another refinement, the incident beam of coherent light has a surface area (e.g., cross-sectional) ranging from about 0.5 mm$^2$ to 5 mm$^2$ on the substrate. In another refinement, the deposited component comprises diamond, for example comprising single-crystal diamond (SCD).

Measurements obtained during the deposition process can be used to characterize the substrate during deposition. In a refinement, the process further comprises determining from the incident distribution of the reflected and scattered light an average local surface angle of the substrate. In another refinement, the process further comprises determining from the incident distribution of the reflected and scattered light a local surface roughness of the substrate. In another refinement, the process further comprises performing parts (c) and (d) at different local interrogation points on the substrate and determining the average local surface angle of the substrate and optionally the local surface roughness of the substrate at the different local interrogation points to determine a local surface curvature of the substrate. In another refinement, the process further comprises determining from the local surface curvature of the substrate that substrate has a locally convex surface. In another refinement, the process further comprises determining from the local surface curvature of the substrate that substrate has a locally concave surface. In another refinement, the process further comprises determining from the local surface roughness whether local surface defects have developed. In another refinement, the process further comprises determining from the average local surface angle and the local surface curvature of whether the substrate is maintaining a target surface slope. In another refinement, the process further comprises determining from the average local surface angle the total growth surface area of the substrate.

While the disclosed apparatus, systems, processes, methods and compositions are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

Figure 1A:
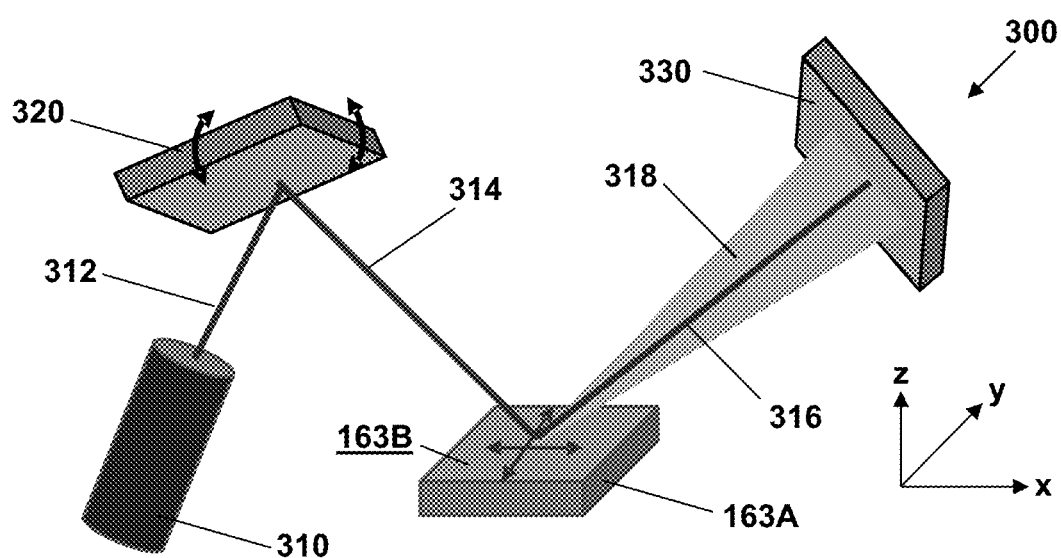
FIG. 1A is schematic of an optical measurement system for use with a microwave plasma assisted reactor (or microwave cavity plasma reactor; "MCPR") for measuring surface properties of a substrate being grown in the MCPR.

While the disclosed apparatus, compositions, articles, and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The disclosure relates to microwave cavity plasma reactor (MCPR) apparatus and associated optical measurement system that enable microwave plasma assisted chemical vapor deposition (MPACVD) of a component such as diamond while measuring the local surface properties of the component while being grown. Related methods include deposition of the component, measurement of the local surface properties, and/or alteration of operating conditions during deposition in response to the local surface properties. As described in more detail below, the MPCR apparatus includes one or more electrically conductive, optically transparent regions forming part of the external boundary of its microwave chamber, thus permitting external optical interrogation of internal reactor conditions during deposition while providing a desired electrical microwave chamber to maintain selected microwave excitation modes therein.

Figure 1B:
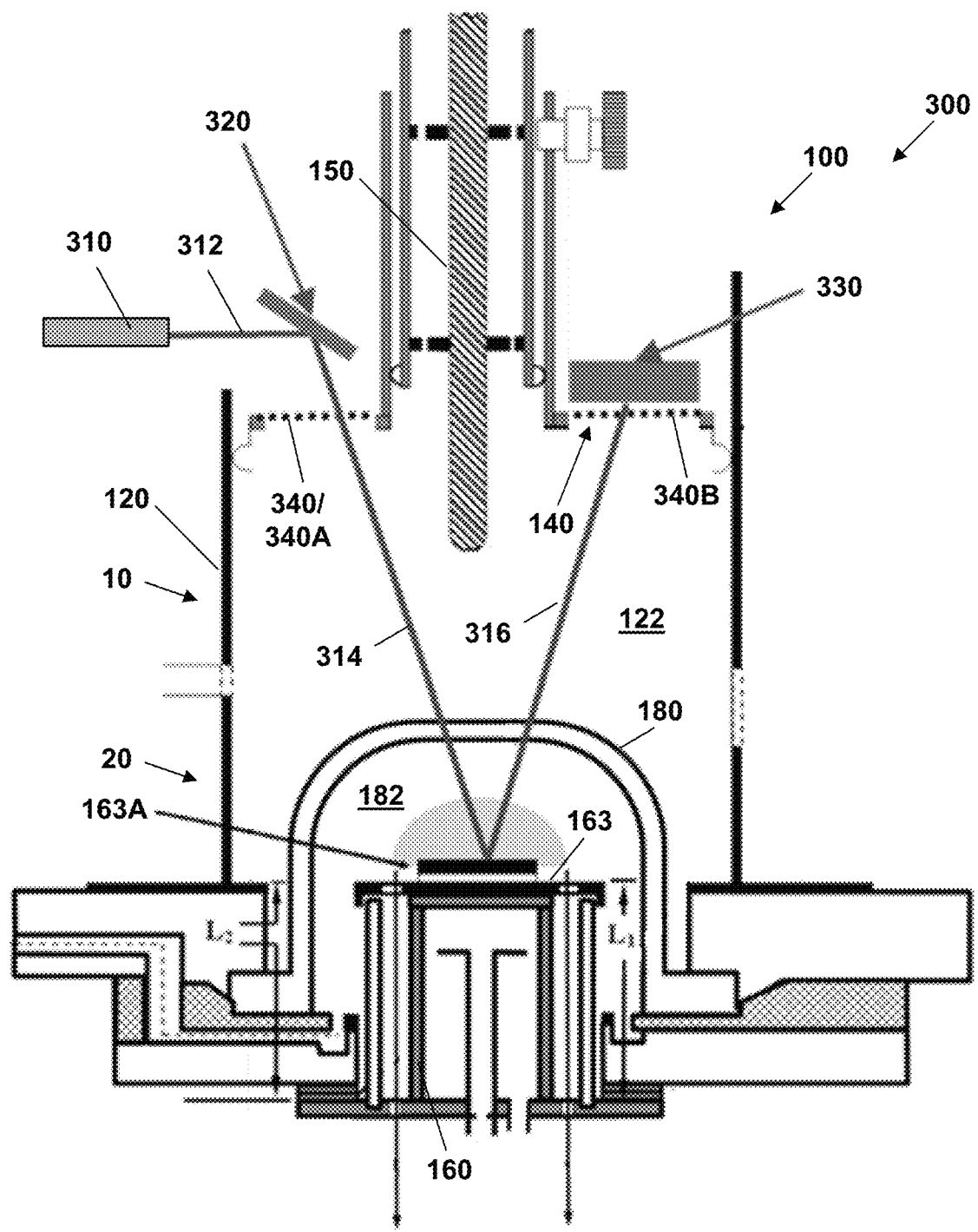
FIG. 1B is a cross sectional view of a microwave plasma assisted reactor including an optical measurement system according to the disclosure in which optical access into the reactor is via an upper conducting short.
Figure 1C:
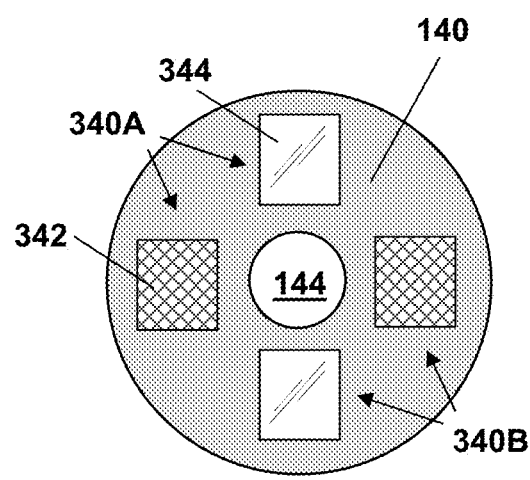
FIG. 1C is a top view of the upper conducting short of FIG. 1B.
Figure 1D:
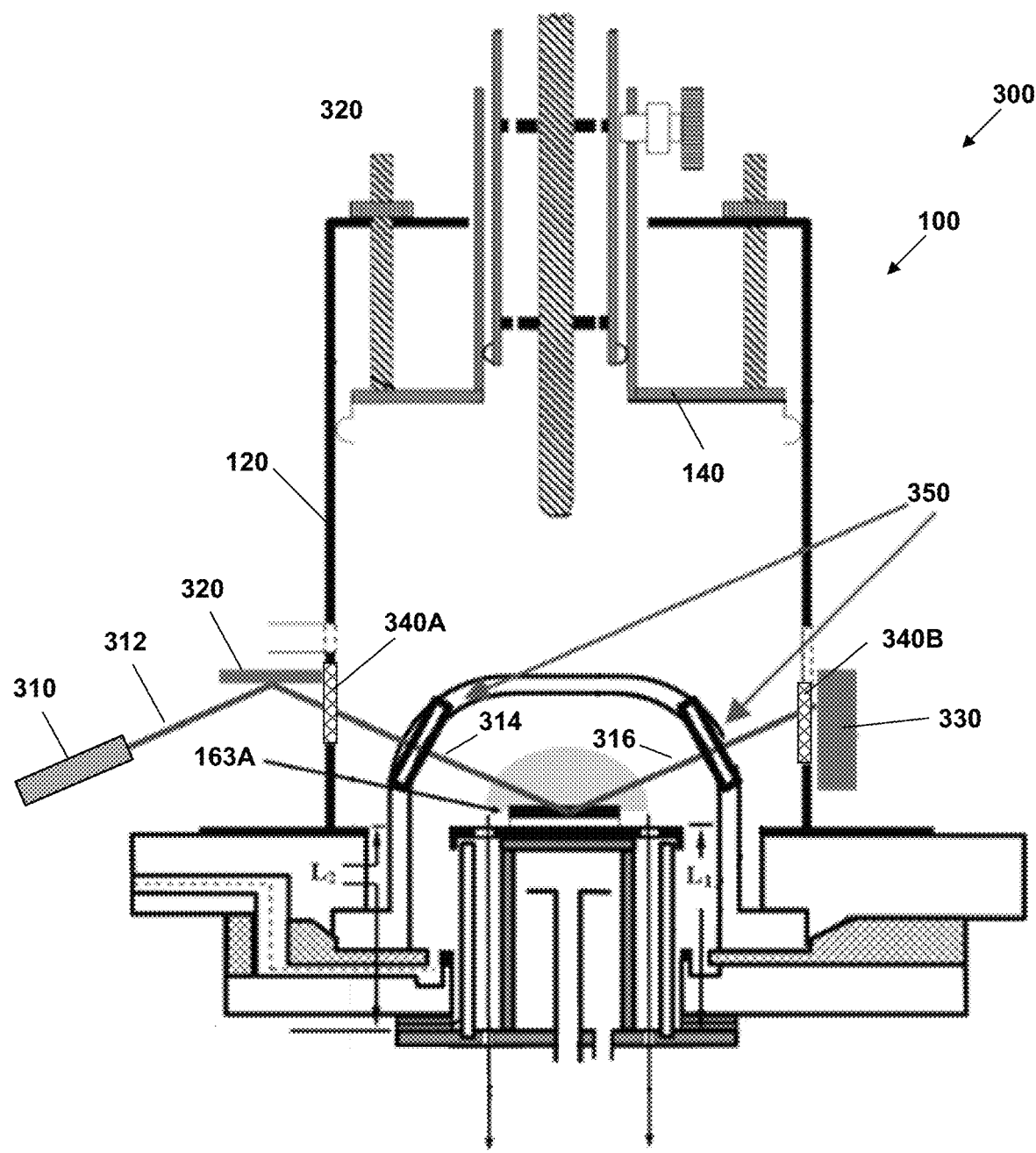
FIG. 1D is a cross sectional view of a microwave plasma assisted reactor including an optical measurement system according to the disclosure in which optical access into the reactor is via a cylindrical microwave chamber boundary.

FIGS. 1B-1D illustrate various embodiments of a microwave plasma assisted reactor 100 according to the disclosure. Other geometric, structural, and operational features of the reactor 100 are described in more detail below with reference to FIGS. 2A-2F. The reactor 100 includes a (first) microwave chamber 10 (e.g., a cylindrical chamber 120 as illustrated) having an internal volume 122. In some embodiments, the microwave chamber 10 further includes an upper conducting short 140, which is in electrical contact with an outer wall (e.g., the outer wall of the cylindrical chamber 120) of the microwave chamber 10. The upper conducting short 140 is located in an upper portion of the microwave chamber 10 and defines at least a portion of an upper boundary thereof (e.g., having a generally annular surface defining a central opening 144 therethrough for an electromagnetic wave source 150). The reactor 100 also includes a plasma chamber 20 extending into the microwave chamber 10, which includes an outer wall defining at least a portion of the chamber 20, for example including a quartz bell jar 180 as a portion of the outer wall and defining an interior cavity 182 of the plasma chamber 20. The outer wall of the plasma chamber 20 includes an optical window forming at least a portion of the outer wall and providing optical access into the interior cavity 182. In some embodiments, the optical window can be the quartz bell jar 180 itself or a portion thereof. The reactor 100 further includes an excitation probe 150 as an electromagnetic wave source, which is positioned and adapted to direct microwave energy into the microwave chamber 10 and the plasma chamber 20. As further shown, the reactor 100 includes a stage 160 (e.g., a coaxial stage, which could also be a conducting stage) with reference surface 163 (e.g., a substrate holder) extending into the plasma chamber 20/interior cavity 182 thereof. The reference surface 163 is positioned and adapted to supporting a substrate 163A upon which a component is deposited during operation of the reactor 100.

The reactor 100 further includes one or more electrically conductive, optically transparent regions 340 which form part of the external boundary of the microwave chamber 10. As illustrated, the reactor 100 can include at least a first electrically conductive, optically transparent region 340A and a second electrically conductive, optically transparent region 340B. The first region 340A and second region 340B are spatially positioned on the microwave chamber 10 external boundary such that, when the substrate 163A is present in the reactor 100 (e.g., on the stage reference surface 163), the emitted light 312 (e.g., the laser beam) from the coherent light source 310 passing through the first region 340A is in optical communication with the second region 340B by (i) passing through the first region 340A, (ii) passing through the optical window 180/350, (iii) reflecting off the substrate 163A (or the substrate holder 163 in some cases), (iv) passing through the optical window 180/350, and (v) passing through the second region 340B. As used herein, optical communication includes the ability of light to travel to, through, and from the various structural components, for example from an outside environment external to the reactor 100, through the internal volume 122, and through the interior cavity 182. As the emitted light 312 travels along its optical path, it can be reflected (e.g., off the mirror 320; off smooth regions of the substrate 163A), it can be refracted (e.g., passing through the optical window 180/350; passing through the regions 340A, 340B when they are also optical windows as described below), and/or scattered (e.g., off rough regions of the substrate 163A), for example to form the incident 314, reflected 316, and scattered 318 light beams described above.

The first and second regions 340A, 340B are not particularly limited and can include any structure that is both electrically conductive and optically transparent. The regions 340A, 340B can be formed essentially entirely from an electrically conductive material (e.g., a metal such as stainless steel, such as in the form of a metal mesh), or they can be formed from a generally non-electrically conductive material (e.g., glass, quartz) that further includes an electrically conductive coating or other portion that permits electrical conduction through the region to surrounding portions of the microwave chamber 10. Electrical conductivity of the regions 340A, 340B permits the microwave chamber 10 as a whole to contain or confine microwaves with the resonant cavity 120 and maintain desired microwave excitation modes therein. The regions 340A, 340B can include one or more open areas through which light can pass freely without changing transmission media, or they can be formed from an optically transparent material through which light can pass while substantially or completely maintaining its coherency, even if it is refracted therethough (e.g., glass, quartz). For example, in some embodiments, the first and second regions 340A, 340B can be in the form of a metallic screen or mesh 342 (e.g., as illustrated in FIG. 10). The metallic screen 342 to be formed from stainless steel or other suitable metal. Open areas in the screen 342 permitting optical transmission are suitably large compared to the fractional area blocked by the screen structure (e.g., a wire mesh) such that a substantial majority of incident light passes through the screen 342 (e.g., at least 70%, 80%, 90%, 95%, 98%, or 99%). Further, the metal mesh size is suitably less in dimension than the diameter of the light beam (e.g., about 1 mm to 2 mm in diameter as originally formed by the light source 310 and before any scattering). Specifically, the metal wire size or metal strips in the mesh suitably have a smaller dimension that the laser beam diameter, which allows the position of the reflected light exiting the reactor 100 via the second region 340B in the form of the metallic screen 342 can be determined accurately. In other embodiments, the first and second regions 340A, 340B can be in the form of an electrically conducting optical window 344 (e.g., as illustrated in FIG. 10). The window 344 can be formed from glass or quartz material that is coated with an electrically conducting transparent film (e.g., a film on the window surface facing the reactor 100 interior 122) that permits light transmission therethrough but not microwave energy. Examples of suitable electrically conductive materials that can be used to form transparent films (e.g., materials which are naturally transparent or films which are thin enough to be essentially transparent) include indium tin oxide (ITO) and other conductive transparent metal oxides, graphite (e.g., exfoliated graphene nanoplatelets (EGN)), conductive polymers (e.g., polyaniline, polypyrrole, etc.), and the like.

The particular spatial location and structural configuration of the first and second regions 340A, 340B are not particularly limited and can be selected as desired as long as they provide the optical paths for light to enter the reactor 100, reflect and/or scatter from the substrate 163A surface, and exit the reactor 100 for detection and evaluation. As generally illustrated in the figures, the first and second regions 340A, 340B can be separate regions of the microwave chamber 10 external boundary. For example, the regions 340A, 340B can be two spatially separated regions on opposing sides of the microwave chamber 10 cylindrical outer wall 120, or on the top of the upper sliding short 140 surface (e.g., which can otherwise a continuous annular metallic surface). In an embodiment illustrated in FIGS. 1B and 10, the regions 340A, 340B are each positioned on the upper conducting short 140 (e.g., as a generally annular metallic material with the two screen or window regions on diametrically opposed portions of the upper conducting short/annulus). In an embodiment illustrated in FIG. 1D, the first and second regions 340A, 340B are each positioned on an outer wall of the microwave chamber 10 (e.g., outer cylindrical wall thereof with two screen or window regions on diametrically opposed portions of the cylindrical wall 120). In another embodiment (not shown), the first region 340A is positioned on an outer wall of the first microwave chamber 10 and the second region 340B is each positioned on the upper conducting short 140. This arrangement can accommodate a deposition process in which the upper surface of the substrate 163A is angled (e.g., relative to the $Z_0$ plane, described below), whether as initially cut or due to a sloped substrate holder/stage. This arrangement can provide optical access thorough the cylindrical wall 120 on one side and through the upper conducting short 140 on the other side, which can be useful in some cases where having a slightly angled or off-flat substrate 163A can provide higher quality growth of the deposited component (e.g., diamond or otherwise). Alternatively, the regions 340A, 340B can be portions of the same region of the microwave chamber 10 external boundary, such as where there is a single, larger area metallic screen or optical window where incident laser light passes through one region/area as the first region 340A into the reactor 100 and reflected/scattered light passes through a different region/area as the first region 3BOA of the screen or window to the light intensity detector 300 (e.g., focal plane array).

As described above, the outer wall of the plasma chamber 20 includes an optical window forming at least a portion of the outer wall and providing optical access into the interior cavity 182. The optical window is optically transparent such that a coherent light beam (e.g., laser beam) passing through remains substantially coherent. In some embodiments, the optical window can be the quartz bell jar 180 itself or a portion thereof. As illustrated, the quartz bell jar 180 can have slightly rounded or curved surfaces, which are suitable to provide optical access into and out of the interior cavity 182 while still permitting accurate determination of the optical path of the detected light 316, 318 (i.e., which allows determination of the spatial location on the substrate 163A to which the detected light 316, 318 and corresponding surface properties relate). In some embodiments (e.g., either with or without flat window regions), possible distortion of the optical path through the plasma chamber 20 can be characterized or determined by making control optical path measurements through the reactor 100 with a polished mirror in place of the substrate 163A and while the reactor 100 is not in operation to deposit a component (e.g., by directing light across the mirror surface at different spatial locations and measuring/detecting the corresponding mirror-reflected light). Under conditions of essentially perfect reflection off of the mirror surface, any other distortion of the optical path can be attributed to the reactor 100 components, and the distortion can be used to correct optical path determinations for measurements made when subsequently depositing a component on the substrate 163A during reactor 100 operation.

In some embodiments of the plasma chamber 20, the optical window can include two flat external surfaces or windows 350 on the quartz bell jar 180 (e.g., on generally opposing sides of the jar 180 to correspond to general incoming and outgoing optical paths for incident and reflected/scattered light). The flat external surfaces 350 can have planar opposing surfaces and a constant thickness. The flat external surfaces 350 can be the top portion of the quartz bell jar 180. The jar 180 can be manufactured to include the flat surfaces 350, or an existing jar 180 can be polished to create the flat surfaces 350. The size of the flat surface 350 is not particularly limited. In some cases, the flat surfaces 350 can have an area generally corresponding in size to that of the incident laser light (e.g., 1 mm to 2 mm in diameter or width, such as a generally circular or rectangular/square flat window surface), which size can be used to determine whether the relative degree of reflection off of the substrate 163A is increasing or decreasing. In another embodiment, the flat surfaces 350 can have an area generally corresponding in size to that of the substrate 163A (e.g., 0.5 cm or 1 cm to 2 cm in diameter or width, such as a generally circular or rectangular/square flat window surface), thereby providing optical access to and from the substrate 163A through the flat surfaces 350 at most or all spatial locations on the substrate 163A. In an embodiment as illustrated in FIG. 1D, the optical window of the jar 180 more generally can include a first and second optical window regions 350 on generally opposing sides of the jar 180. The first optical window region 350 is positioned such that coherent light 314 passing through the first region 340A and to the substrate 163A (when present) also passes through the first optical window region 350. Similarly, the second optical window region 350 is positioned such that light 360 reflecting (and/or scattering) off the substrate 163A (when present) and passing through the second region 340B also passes through the second optical window 350.

As described above, the disclosure further relates to a microwave plasma assisted reactor optical measurement system 300 including the reactor 100 according to any of its various embodiments, the laser or other coherent light source 310, optionally the steerable mirror or other means 320 for directing incident light to a desired spatial location on the substrate 163A, and the focal plane array or other means 330 for detecting a spatial distribution of reflected or scattered light energy. The steerable mirror 320, when present, can be externally mounted to any suitable (motorized) support structure external to the reactor 100 so that it is positioned and moveable to receive an incident beam 312 of coherent light external to the reactor 100 and to direct a reflected beam 314 of the coherent light through the first region 340A and into the microwave chamber 10 internal volume 122 (e.g., further through the plasma chamber 20 optical window, into the plasma chamber 20, and onto the substrate 163A therein at a desired location thereof). In some embodiments, the steerable mirror 320 can be omitted and the light source 310 can be aimed directly into the reactor 100 at the desired location(s). For example, the light source 310 itself could be mounted to a moveable/steerable support, and/or some internally moveable optical components of the light source 310 can allow the emitted light 312 to be directed at different angles. The coherent light source 310 is positioned and adapted to deliver and direct the incident beam 312, 314 of coherent light through the first region 340A and into the microwave chamber 10 internal volume 122 (e.g., further through the plasma chamber 20 optical window, into the plasma chamber 20, and onto the substrate 163A therein), for example by reflection off the steerable mirror 320 or direct projection into the microwave chamber 10 internal volume 122 via the first region 340A. The coherent light source 310 is suitably a laser, for example a HeNe laser, a semiconductor laser, etc. The means for detecting a spatial distribution of incident light energy 330 is positioned to receive an incident distribution of light 316, 318 that has been reflected and/or scattered from the reflected beam 314 of coherent light by a substrate 163A (when present) on the stage reference surface 163 (e.g., considering that the substrate 163A could have a variable position for its top surface based on current state of substrate growth and position of the stage itself for an adjustable-height stage). The light detection means 330 is not particularly limited, and suitable detectors available for measuring light intensity as a function of position include a focal plane array, a linear detector array, and a four-quadrant photodetector. The light detection means 330 suitably is mounted (e.g., fixedly or otherwise non-moveably mounted) to the reactor 100 or an external support structure (not shown) so that it is positioned at or near the second region 340B (e.g., within 1 cm, 2 cm, 5 cm, 10 cm, or 20 cm), thereby increasing the relative fraction of light 316, 318 detected for a given size detector 330 (e.g., based on an expanding cross sectional area for the scattered light 318 component), which are commonly available in sizes having lateral dimensions ranging from about 25 mm to 40 mm. In some embodiments (not shown), an optical band pass filter is placed in front of the detector 330 (e.g., between the detector 330 and the second region 340B) In some embodiments (not shown), the system 300 can include multiple sets of light sources 310, steering mirrors 320 (when present), and detectors 330. For example, one set can be adapted to measure through regions 340A, 340B in the sliding short 140 and one set can be adapted to measure through regions 340A, 340B in the sides of the reactor 100 chamber 20. Having such multiple set can permit larger-area substrates to be measured by using multiple sets of regions 340A, 340B, which in turn permits each individual region 340A, 340B to be relatively small in size (e.g., reducing the degree to which the reactor 100 structure is modified to incorporate the regions 340A, 340B while still being able to maintain the desired electromagnetic microwave modes within the reactor 100).

In an embodiment, the reactor system 300 further includes a computer (not shown) to control the system 300 components, acquire reflected/scattered light intensity distribution data during deposition, store such data in a computer readable storage medium, analyze or process such data to determine substrate 163A characteristics during deposition, and/or adjust operation of the system 300 components in a feedback control scheme based on the analyzed data/substrate 163A characteristics. The computer generally includes a processor and memory coupled to a computer readable storage medium encoded with a computer program. The computer program includes instructions that, when executed by the processor, cause the computer to control one or more of the steerable mirror 320 (e.g., repositioning the same) when present, the coherent light source 310 (e.g., activating the light source 310 to deliver the incident beam 312 of coherent light), and the detection means 330 (e.g., measuring reflected/scattered light 316, 318 intensity distribution as a function of time) during operation of the reactor 100 (e.g., during deposition of a component such as diamond on the substrate 163A). The computer system additionally can be programmed to determine/calculate scattering statistics from the detection means 330 and then issue alerts and/or warnings as appropriate to a user, halt deposition of the component, alter deposition conditions for the components, etc. as part of a feedback loop and the general process described herein.

High Pressure Microwave Discharges

At high pressures and high power densities, microwave discharges in hydrogen gas have neutral gas temperatures in excess of 2500 K, contract and separate from the surrounding discharge chamber walls, and become a very non-uniform, intense and "arc like" discharge. As pressure is increased, the gas temperature and discharge power density increase, resulting in a floating discharge with increased active radical plasma species having the potential for increased growth rates. The formation of contracted and floating microwave discharges at high pressures, which are identified herein as microwave arcs, has been observed and studied in many experiments. The microwave arc, like lower frequency arcs, is a thermally inhomogeneous discharge. It has a hot central core, and sharp thermal gradients exist between the discharge center and the surrounding walls. Microwave energy is readily coupled into the electron gas in the hot discharge center because of its reduced gas density, and neutral gas species are also readily ionized, dissociated, and excited in the hot central discharge core. These high pressure microwave discharges have been applied as discharges in electrothermal thruster space engines and as high pressure, high power microwave discharge light sources.

An important difference between high pressure and low pressure microwave discharges is that the microwave discharge entirely fills the discharge chamber at low pressures and produces a diffusion loss dominated, cold (i.e., gas temperatures are less than 1000 K), non-equilibrium plasma. In the high pressure regime, the microwave discharge is hot (i.e., gas temperatures are greater than 2000 K), is volume recombination dominated, and becomes a more thermal-like discharge. Plasma densities for 2.45 GHz hydrogen discharges operating at 100 Torr to 200 Torr are estimated to be about $10^{11}$ $cm^{-3}$ to about $10^{13}$ $cm^{-3}$ (i.e., free electrons per unit volume). At these high pressures, the discharge separates from the walls and can become freely floating, taking on shapes that are related to the shape of the impressed electromagnetic fields. The discharge can even move about the discharge chamber as it reacts to the buoyant forces on the discharge and to the convective forces caused by the gas flows in the discharge chamber (e.g., source gas inlet and exhaust gas outlet).

Thus, high pressure microwave discharges behave very differently from the typical low pressure discharge and require new methods of discharge control and microwave applicator and plasma reactor design that take into account the distinctly unique nature of the high pressure microwave plasma. The goal in a CVD application is to control the size, the spatial location and the shape of this very hot, non-uniform discharge in such a manner to enable optimal CVD diamond synthesis. This is a formidable engineering challenge. High pressure plasma reactors and associated methods allow the spatial positioning and shaping of this thermally inhomogeneous, hot microwave discharge, thereby enabling the optimization of the diamond CVD process at high pressure.

Reactor Geometry

Figure 2A:
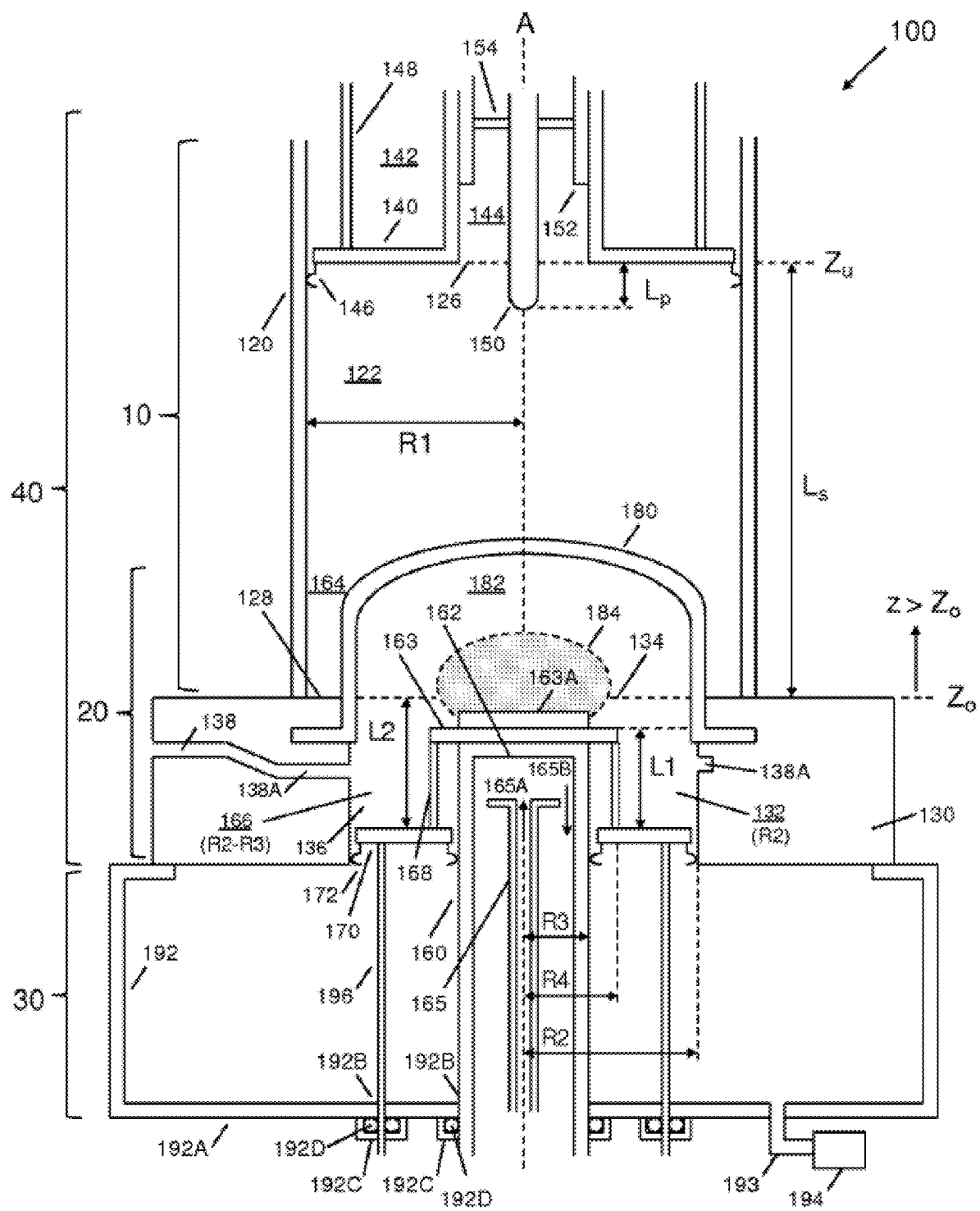
FIG. 2A is a cross-sectional view of a microwave plasma assisted reactor (or microwave cavity plasma reactor; "MCPR") embodiment according to the disclosure.
Figure 2B:
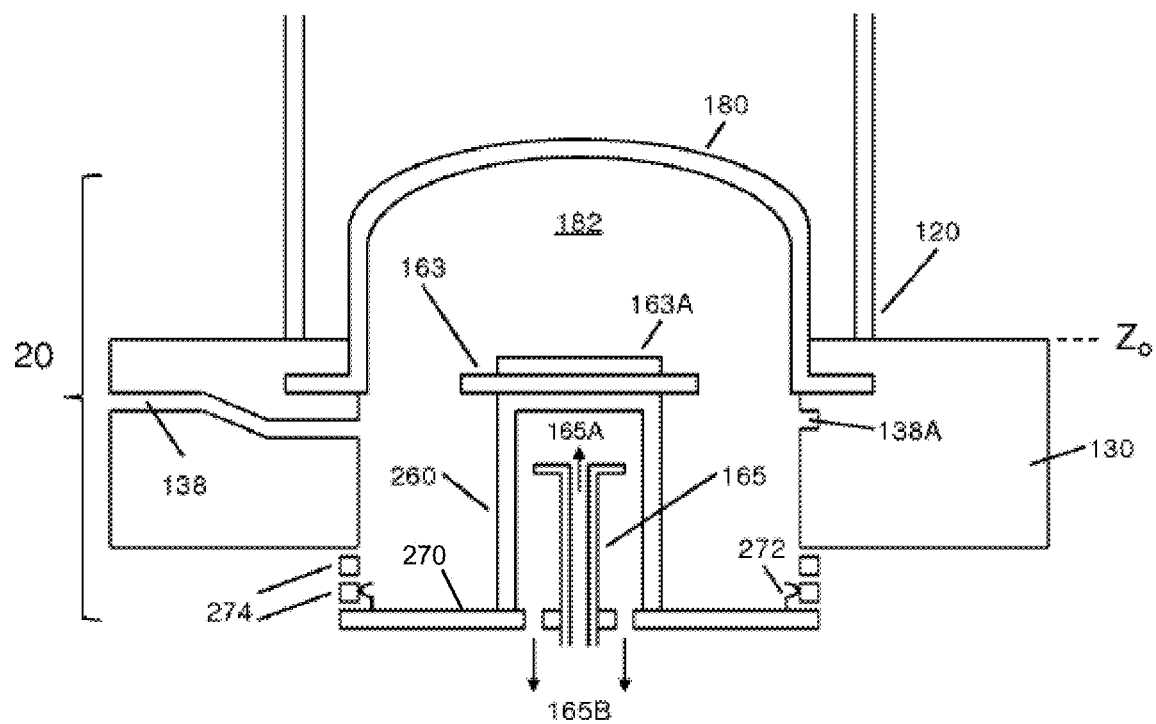
FIG. 2B is a cross-sectional view of an alternative embodiment for a plasma chamber for the microwave plasma assisted reactor of FIG. 2A.
Figure 2C:
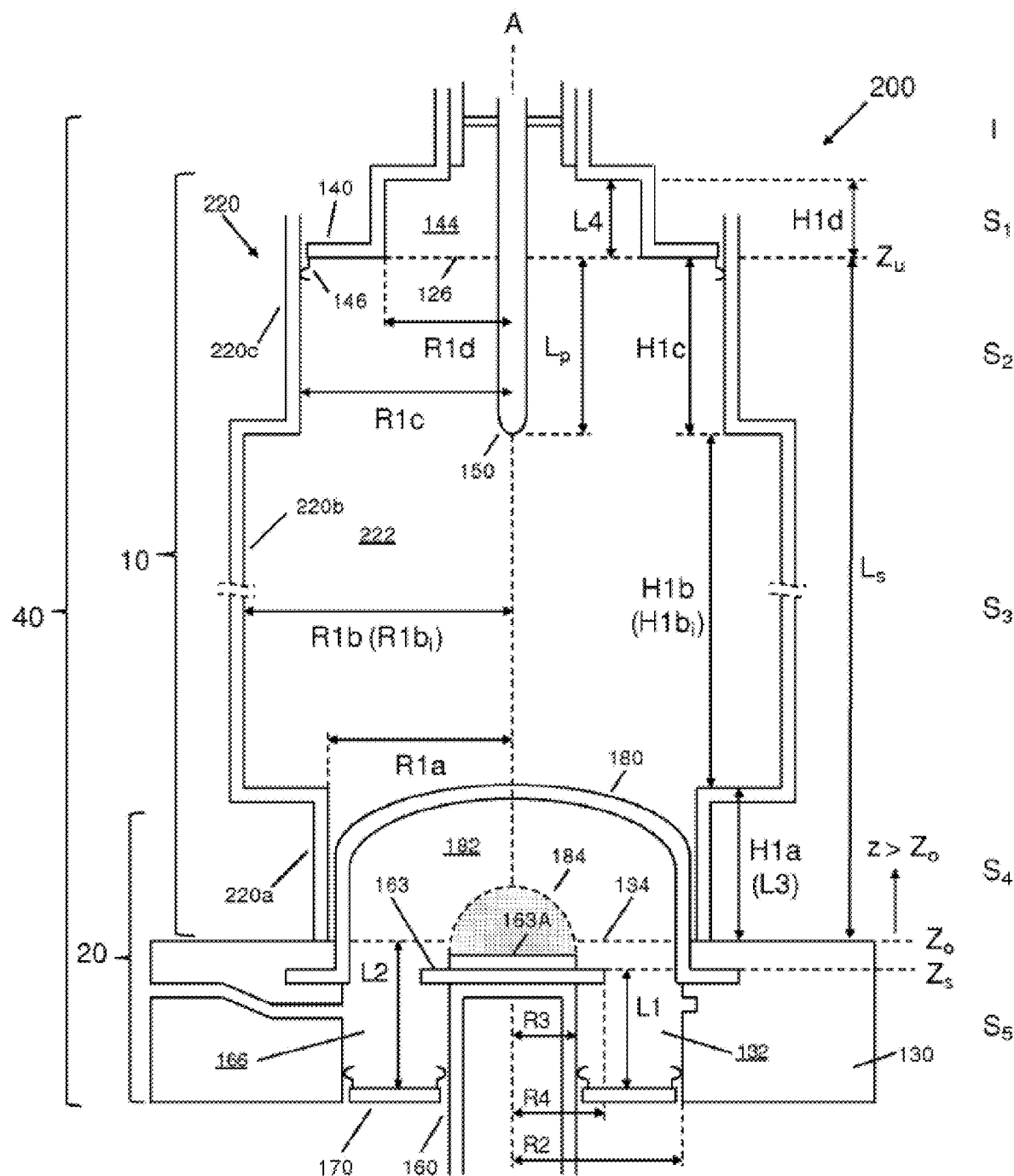
FIG. 2C is a cross-sectional view of a generalized microwave plasma assisted reactor embodiment according to the disclosure.
Figure 2D:
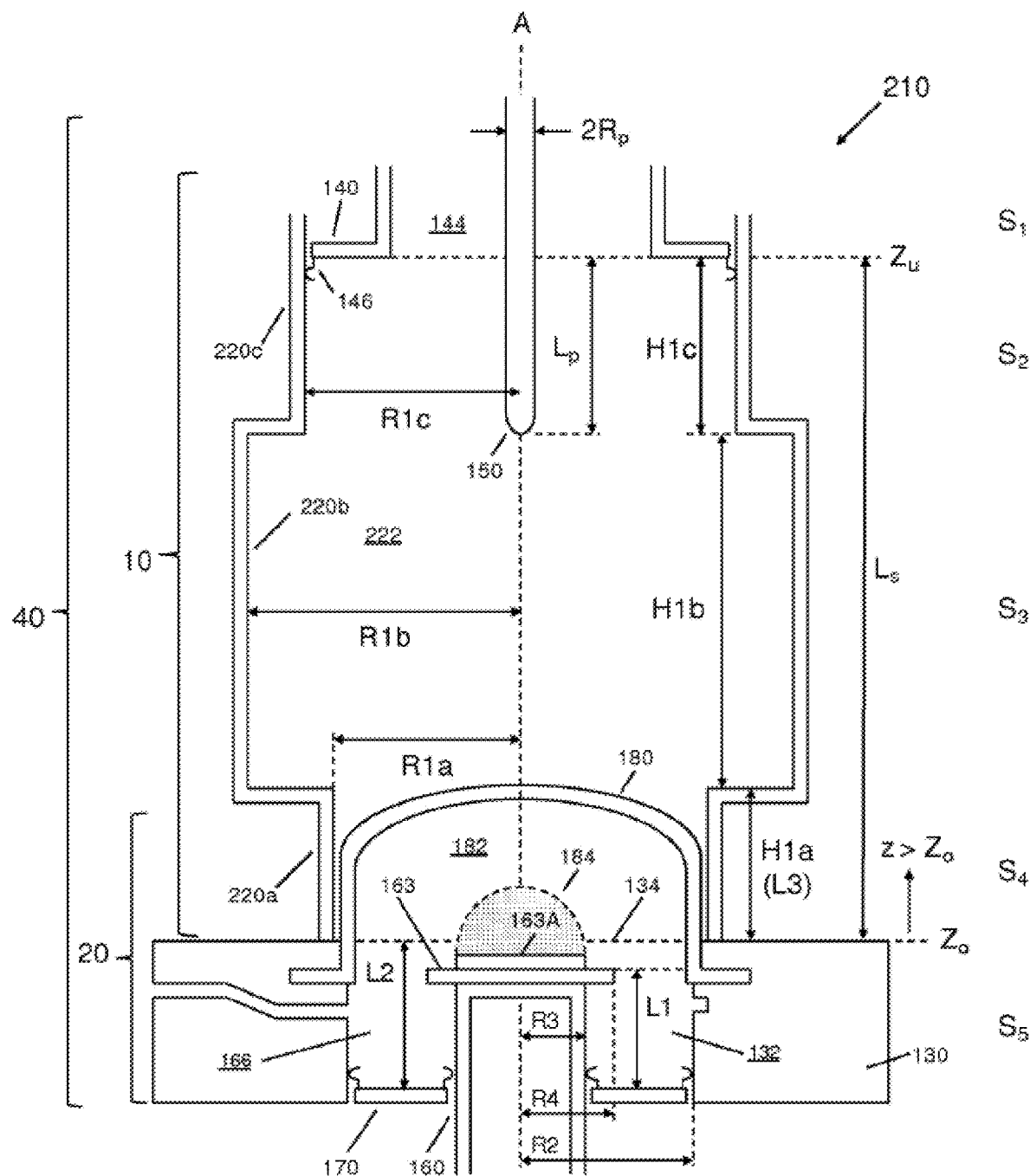
FIG. 2D is a cross-sectional view of a microwave plasma assisted reactor embodiment with a three-section microwave chamber according to the disclosure.
Figure 2E:
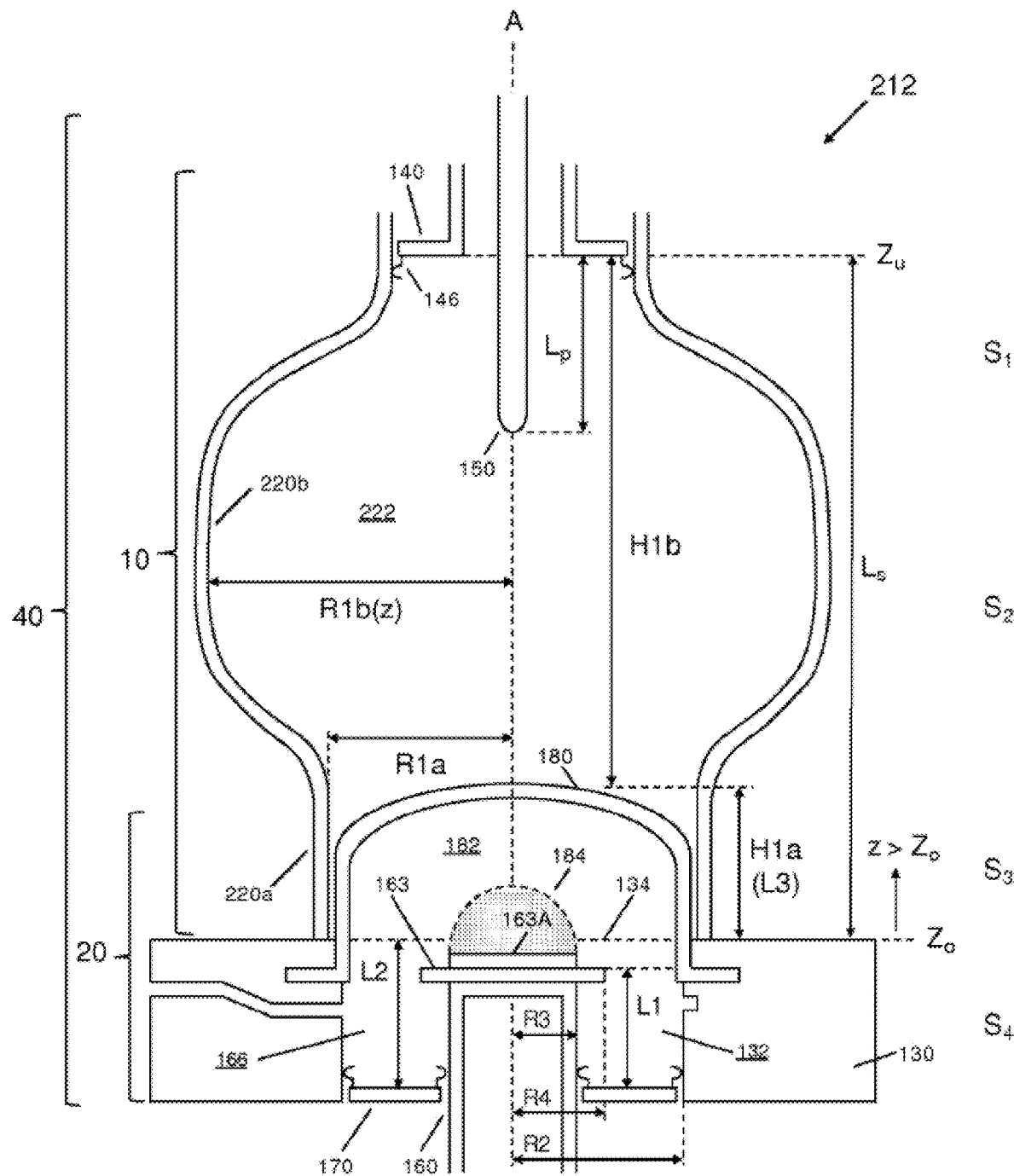
FIG. 2E is a cross-sectional view of a microwave plasma assisted reactor embodiment with a variable-radius microwave chamber according to the disclosure.
Figure 2F:
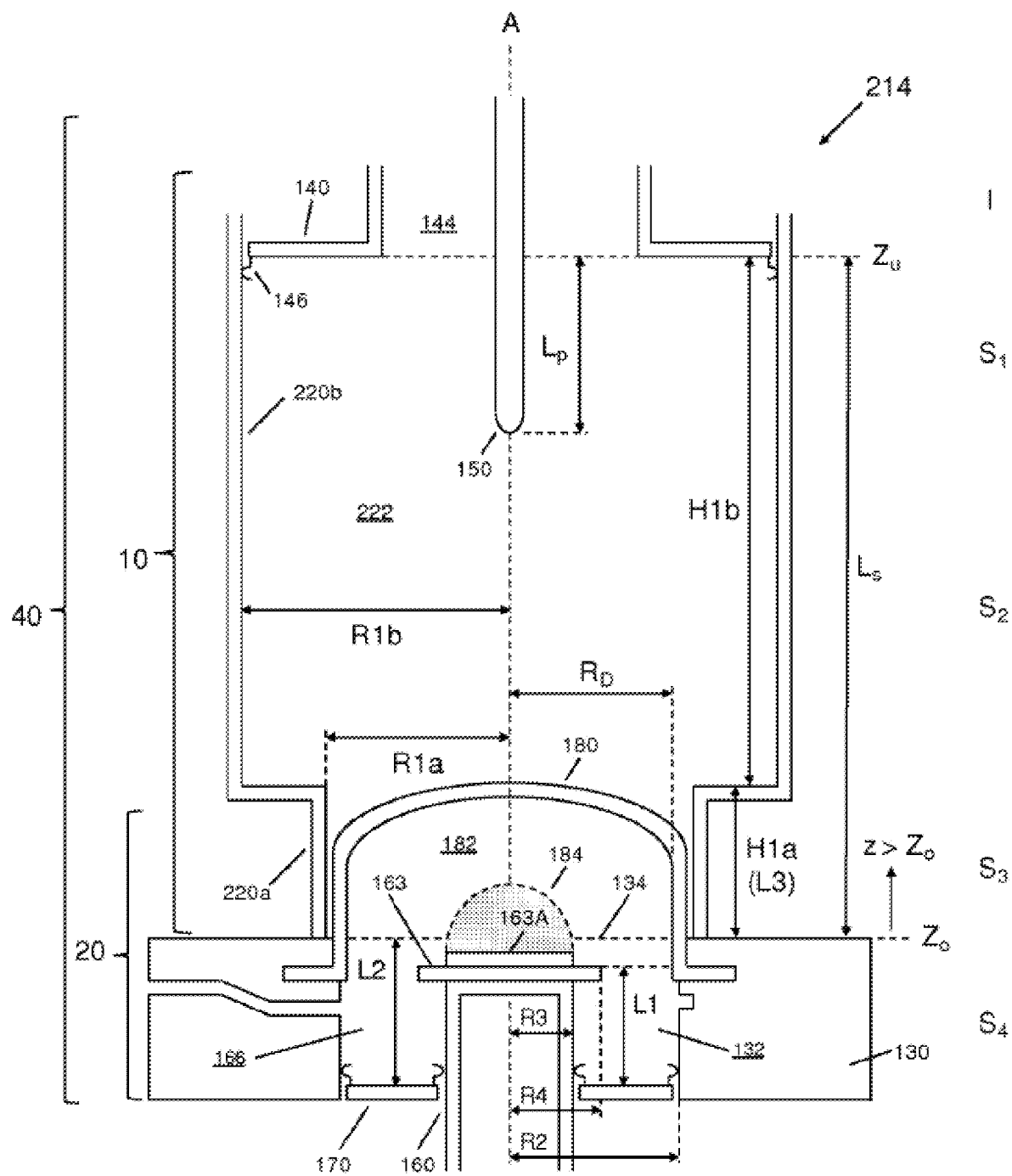
FIG. 2F is a cross-sectional view of a microwave plasma assisted reactor embodiment with a two-section microwave chamber according to the disclosure.

FIGS. 2A 2F illustrate various embodiments of microwave plasma assisted reactors 100 suitable for use according to the disclosure. Any of the various embodiments in FIGS. 2A-2F can be modified to include microwave chamber 10 first and second optically transparent regions 340A, 340B as well as a plasma chamber 20 optical window 180/350 to provide desired optical access to a substrate 163A in the reactor 100 during deposition, for example as described above and analogously illustrated in FIGS. 1B-1D. The embodiments according to FIGS. 2A-2F which incorporate such optical access structure can further be incorporated into the system 300 as described above in relation to FIGS. 1A-1D.

A cross sectional view of a particular microwave plasma assisted reactor 100 is illustrated in FIG. 2A. The reactor 100 generally includes a microwave chamber/section 10, a plasma chamber/section 20, and a vacuum chamber/section 30. The reactor 100 has a generally cylindrical structure with components that are generally aligned along a central axis A (e.g., the z-axis in a cylindrical coordinate system with substantial component symmetry in the θ (or phi, ϕ) direction). Collectively, the microwave chamber 10 and the plasma chamber 20 are referenced as an applicator 40. The microwave chamber 10 and the plasma chamber 20 meet at a reference axial location $Z_0$ (or z=0). The applicator 40 includes two coupled cavities at the $Z_0$ plane: a cylindrical cavity section ($z \geq Z_0$) and a coaxial cavity section ($z \leq Z_0$).

The microwave chamber 10 includes a cylindrical chamber 120 (e.g., an open-ended metallic cylinder) defining an interior cylindrical cavity 122 of radius R1 aligned with the central axis A. The cylindrical cavity 122 has a lower boundary 128 (e.g., a metallic portion of the base 130) at the reference axial location $Z_0$ and an upper boundary 126 at an axial location $Z_u > Z_0$ (i.e., the microwave chamber 10 generally extends upwardly in an axial direction $z > Z_0$). The microwave chamber 10 can be cooled with an external coolant, for example with cooling lines (e.g., for water or other cooling liquid) on the exterior of the cylindrical chamber 120 and/or with a cooling gas inlet/outlet (e.g., for air or other cooling gas) in fluid communication with the cylindrical cavity 122. As illustrated, the cylindrical chamber 120 has a uniform radius R1 throughout its height. In alternative embodiments, the cylindrical chamber 120 can have a multi-section construction, for example including a first cylindrical chamber of radius R1a (or other characteristic width dimension for non-cylindrical chambers) adjacent to the base 130 and a second cylindrical chamber of radius R1b adjacent to the first cylindrical chamber and extending upwardly away from the base 130. In general, R1a can be less than or greater than R1b depending on the resulting influence upon the microwave field in the microwave chamber 10.

The microwave chamber 10 further includes an upper conducting short 140 in electrical contact with the cylindrical chamber 120 and disposed in an upper portion 142 of the cylindrical chamber 120 at an axial distance Ls above Z0. The upper conducting short 140 has a central opening 144, defines the upper boundary 126 of the cylindrical chamber 120, and is electrically connected to the side walls of the cylindrical chamber 120 via finger stocks 146. Preferably, the upper conducting short 140 is slidably disposed in the cylindrical chamber 120, and its axial position can be adjusted by any suitable means, for example using a sliding (e.g., threaded) rod/gear assembly (e.g., via rods 148 (mounted to the upper conducting short 140) and as illustrated in more detail in U.S. Pat. No. 5,311,103; incorporated herein by reference).

The microwave chamber 10 further includes an excitation probe 150 as an electromagnetic wave source extending through the central opening 144 of the upper conducting short 140 and into an upper portion of the cylindrical cavity (or microwave chamber) 122 by an axial distance Lp relative to the upper boundary 126. The excitation probe 150 is generally capable of generating radiofrequency waves in the UHF (e.g., about 300 MHz to about 3 GHz) and/or microwave (e.g., about 300 MHz to about 300 GHz or about 300 MHz to about 100 GHz) frequency domain. Suitable specific excitation frequencies include 915 MHz and 2.45 GHz. As illustrated, the excitation probe 150 is supported in an inner sleeve 152 by an insulator/holder 154. The inner sleeve 152 preferably is adjustably mounted on the interior annular surface of the upper conducting short 140. Similar to the upper conducting short 140, the excitation probe 150 also is adjustably disposed in the cylindrical chamber 120, and its axial position can be adjusted by any suitable means, for example using a gear assembly to slide the inner sleeve 152 and the excitation probe 150 as a unit relative to the upper conducting short 140 (e.g., as illustrated in U.S. Pat. No. 5,311,103; incorporated herein by reference). In an embodiment, the axial positions of both the upper conducting short 140 and the excitation probe 150 are independently adjustable to provide an impedance tuning mechanism to minimize reflected power in the cylindrical cavity 122.

The plasma chamber 20 includes a base 130 (e.g., a metallic base) that defines an interior base cavity 132 (e.g., a cylindrical cavity of radius R2) and that is mounted to the cylindrical chamber 120 of the microwave chamber 10. The interior base cavity 132 has (i) an upper boundary 134 at Zo and adjacent the cylindrical chamber 120 and (ii) a lower portion 136 extending axially downwardly in a direction $z < Z_0$. As illustrated, the base 130 includes a source/feed gas inlet in fluid connection with the base cavity 132, for example a conduit 138 extending through the base 130 and opening into the base cavity 132 through an annular manifold 138A (or other similar structure for tangentially distributing the source gas). The plasma chamber 20 further includes a quartz bell jar 180 mounted in/on the base 130 and extending upwardly into a bottom portion 164 of the cylindrical cavity 122 (i.e., $z > Z_0$). Together, the base 130 and the quartz bell jar 180 define an interior cavity 182 of the plasma chamber 20 (e.g., by an outer wall/boundary including the quartz bell jar 180 and the interior surface (i.e., at r=R2) of the base 130). The base 130 optionally can include cooling channels (e.g., a water cooling channel and/or a gas cooling channel; not shown) that circulate one or more coolants through the base 130 to provide a mechanism for controlling the temperature of the base 130, the quartz bell jar 180, and/or the interior cavity 182 of the plasma chamber 20 during operation of the reactor 100.

The plasma chamber 20 further includes a coaxial stage 160 (e.g., a conductive stage, for example a metallic tube) having a radius R3 and an upper surface 162. The coaxial stage 160 extends at least into the base cavity 132 and optionally into the bottom portion 164 of the cylindrical cavity 122 (i.e., the axial position of the upper surface 162 can be $z \leq Z_0$ or $z > Z_0$ based on the axially adjustable nature of the coaxial stage 160). The coaxial stage defines a coaxial cavity (or microwave chamber) 166 between R3 and R2 in the base cavity 132. A substrate holder 163 (e.g., a molybdenum substrate holder) having a radius R4 is mounted on the upper surface 162 of the coaxial stage 160; during operation of the reactor 100, a deposition substrate 163A is placed on the substrate holder 163. The thickness (i.e., in the z-direction) of the substrate holder 163 is suitably about 0.6 cm; however, the thickness can be varied as an additional means to independently vary L1 and L2. As illustrated, the substrate holder 163 is a flat, disk-shaped structure. Alternatively, the substrate holder 163 can contain a recess (not shown) in its upper surface facing the interior cavity 182, and the deposition substrate 163A is seated in the recess during operation. In an embodiment, the coaxial stage 160 includes internal structure to cool (or otherwise control the temperature of) the substrate 163A during operation. As illustrated, a conduit 165 in the interior of the coaxial stage 160 provides an inlet for a (relatively cold) coolant 165A (e.g., gas or liquid, preferably water) that serves as a heat transfer medium to withdraw heat from the substrate 163A and then exits the coaxial stage 160 as a heated coolant 165B. Alternatively, a relatively hot stream 165A can be used to warm the substrate 163 and then exit as a cold stream 165B.

The plasma chamber 20 further includes a lower conducting short 170 adjustably disposed in the coaxial cavity 166 below $Z_0$ and in electrical contact with the base 130 and the coaxial stage 160 via finger stocks 172. As illustrated, the lower conducting short 170 has a solid annular construction (e.g., a metallic construction); however, the lower conducting short 170 can include one or more channels (or other orifices; not shown) that allow effluent gases to escape from the interior cavity 182 of the plasma chamber 20 into the vacuum chamber 30. The axial distance between the lower conducting short 170 and $Z_0$ is L2, and the axial distance between the lower conducting short 170 and the substrate holder 163 (or a base or bottom portion of the substrate 163A) is L1. Alternatively, the distance L1 can be measured between the lower conducting short 170 and an upper or top portion of the substrate 163A. Together, the two distances define a difference $\Delta L = L1 - L2$ that denotes the displacement of the coaxial stage 160, substrate holder 163, and the substrate 163A from $Z_0$.

As illustrated in FIG. 2A, the plasma chamber 20 can further include a quartz tube holder 168. The quartz tube holder 168 is generally mounted on the lower conducting short 170 and extends upwardly to the substrate holder 163. The quartz tube holder 168 has a radius slightly larger than that of the coaxial stage 160, thereby defining an annular gap between the quartz tube holder 168 and the coaxial stage 160. The quartz tube holder 168 controls the flow of exhaust gas leaving the interior cavity 182 of the plasma chamber 20. Specifically, the substrate holder 163 has holes/conduits (not shown) at the outer radial positions of the substrate holder 163, thereby directing exhaust gas from the interior cavity 182 into the annular gap between the quartz tube holder 168 and the coaxial stage 160. In this case, holes/conduits are placed in the lower conducting short 170 at radial positions between the quartz tube holder 168 and the coaxial stage 160. In an embodiment (not shown), the quartz tube holder 168 can be fixed/mounted to the substrate holder 163 and can have portions that slidably extend through accommodating openings in the lower conducting short 170. In this case, L1 and L2 can be slidably adjusted without having to insert a quartz tube holder 168 of variable height.

FIG. 2B illustrates an alternate embodiment of the lower conducting short 270. The lower conducting short 270 has a disk-shaped structure (e.g., a metallic construction) that is in electrical contact with the base 130 (via finger stocks 272) and with the conducting stage 260 (via direct contact). The axial position of the lower conducting short 270 is adjustable in the coaxial cavity 166 below $Z_0$ by selecting one or more conducting shim inserts 274 (e.g., conducting annular metallic rings of predetermined height) that are interposed between the base 130 and the lower conducting short 270. The structure illustrated in FIG. 2B is held in place during operation, for example, with bolts (not shown) that extend through lower conducting short 270, the shim inserts 274, and into the base 130. As illustrated, the coaxial stage 260 is a cylinder mounted on the lower conducting short 270; however, the coaxial stage can have similar cooling structure as that illustrated in FIG. 2A (e.g., a coolant inlet and a coolant outlet passing through conduits in the lower conducting short 270 and into the interior of the coaxial stage 260).

An aspect of the disclosed reactors is that the geometric reactor length scales L1 and L2 are adjustable by altering the axial location of the lower conducting short 170/270 in the coaxial cavity 166. In FIG. 2A, the illustrated conducting short 170 is a slidable, annular disk that can be moved in the axial direction before and/or during the operation of the reactor 100. In FIG. 2B, the illustrated conducting short 270 is a disk that can be repositioned in the axial direction by altering the number and/or size of the shim inserts 274 that are axially interposed between the base 130 and the lower conducting short 270. Preferably, both of the length scales L1 and L2 are independently adjustable. Thus, in the embodiment illustrated in FIG. 2A, the coaxial stage 160 is independently slidable/adjustable relative to the conducting short 170 such that L2 can be independently adjusted before and/or during the operation of the reactor 100. In the embodiment illustrated in FIG. 2B, the height of the coaxial stage 260 can be adjusted by selecting stages of differing height for mounting to the conducting short 270. The specific methods for adjusting L1 and L2 are not particularly limited, and can include any of a variety of known methods (e.g., using a gear assembly, using an o-ring sealed movable rod, manually repositioning the components, etc.).

The vacuum chamber 30 is defined by vacuum chamber walls 192 that are mounted to the base 130 of the plasma chamber 20 to provide an air-tight seal. The vacuum chamber 30 further includes a conduit 193 through the chamber walls 192 that is connected to a vacuum pump 194 that helps maintain a desired operating pressure in the plasma chamber 20 during operation. As illustrated, a base portion 192A of the chamber walls 192 can include one or more conduits/openings 192B that permit the structural/mechanical coupling of various elements in the plasma chamber to the external environment. For example, vacuum seals 192C (e.g., including an o-ring 192D) can accommodate slidable rods 196 that are attached to the lower conducting short 170 and that extend through the vacuum chamber 30 to the external environment. The rods 196 can be repositioned to adjust the axial position of the lower conducting short 170 by any of a variety of methods (e.g., manual, coupling to a gear assembly similar to that used to adjust the position of the upper conducting short 140, where the gear assembly can be under manual and/or automatic control). As illustrated, a conduit 192B also is provided for the coaxial stage 160 (and any internal structure such as the conduit 165) so that the coaxial stage 160 can be axially repositioned similarly to the slidable rods 196 and the lower conducting stage 170.

Characteristic dimensions and coordinates of the reactor 100 are shown in FIG. 2A. They are the distance $L_p$ that the excitation probe 150 extends beyond the conducting short 140, the height $L_s$ of the cylindrical cavity 122, the radius R1 of the cylindrical cavity, the radii R2 and R3 that define the annular width of the coaxial cavity 166, the radius R4 of the substrate holder 163, the thickness D of the substrate holder 163, and lengths L1 and L2 in the coaxial cavity 166 defining the position of the lower conducting short 170 and the coaxial stage 160. Generally, $R1 \geq R2 \geq R4 \geq R3$ and $L_s \geq L1$ and L2, although other variations are possible. The substrate 163A itself is located approximately at $Z_0$ near the open end of the coaxial cavity 160 on the substrate holder 163. Thus, the upper surface 162 of the conducting coaxial stage 160 serves as a platform for the substrate holder 163, and the interior of the coaxial stage 160 allows temperature control of the substrate 163A (e.g., via water cooling/heating as illustrated). The conducting coaxial stage 160 and the substrate holder 163 are collectively identified as the powered electrode. The difference between L1 and L2 (i.e., L1−L2=ΔL), is the distance that the top surface of the powered electrode or the substrate surface is above or below the cylindrical cavity 122 bottom $Z_0$ plane (z=0).

The specific dimensions of a given reactor design generally scale inversely with the microwave excitation frequency of the excitation probe 150 (i.e., relatively higher probe 150 frequencies generally call for smaller reactor scales and vice versa). Two common excitation frequencies are 2.45 GHz and 915 MHz. For a 2.45 GHz-reactor, suitable dimensions include R1 ranging from about 6 cm to about 12 cm or 18 cm (e.g., about 8.9 cm), R2 ranging from about 5 cm to about 10 cm or 15 cm (e.g., about 7.0 cm), R3 ranging from about 0.5 cm to about 5 cm or 8 cm (e.g., about 0.95 cm, 1.9 cm, or 4.1 cm)), R4 ranging from about 1 cm to about 6 cm or 12 cm (e.g., about 3.25 cm), $L_s$ ranging from about 15 cm to about 25 cm (e.g., about 20 cm), $L_p$ ranging from about 2 cm to about 5 cm (e.g., about 3.6 cm), and/or L1 and L2 independently ranging from about 4 cm to about 8 cm (e.g., |ΔL| about 2 cm, 1 cm, or 0.5 cm or less, including cases where ΔL≠0 (i.e., a net displacement of the substrate 163/coaxial stage 160 from $Z_0$)). For a 915 MHz-reactor, suitable dimensions include R1 ranging from about 15 cm to about 25 cm or 40 cm (e.g., about 30 cm), R2 ranging from about 5 cm to about 30 cm (e.g., about 15 cm), R3 ranging from about 2 cm to about 20 cm (e.g., about 9.5 cm), R4 ranging from about 2 cm to about 20 cm (e.g., about 12 cm), $L_s$ ranging from about 40 cm to about 80 cm (e.g., about 60 cm), $L_p$ ranging from about 5 cm to about 15 cm (e.g., about 8 cm), and/or L1 and L2 independently ranging from about 10 cm to about 20 cm (e.g., |ΔL| about 5 cm, 2 cm, or 1 cm or less, including cases where ΔL≠0 (i.e., a net displacement of the substrate 163/coaxial stage 160 from $Z_0$)).

The ratio R3/R2 can be up to about 0.8 in many applications. An aspect of the disclosure, however, is that a reduction in the size/diameter of the coaxial stage 160 allows an increase in the applied power density of the plasma in a manner that is controllable to permit uniform and high deposition rates (e.g., of diamond) on the substrate 163A. Thus, the radius R3 is suitably small relative to R2. For example, the ratio R3/R2 is suitably about 0.5 or less, about 0.4 or less, about 0.3 or less, or about 0.2 or less. Due to practical structural considerations (e.g., if the coaxial stage 160 include internal temperature control structure), the ratio R3/R2 is suitably about 0.05 or more, or about 0.1 or more.

Another aspect of the disclosure is that relatively fine adjustments of the axial positions of the lower conducting short 170 and/or the coaxial stage 160 (e.g., in the neighborhood of $Z_0$) allow positioning of the electromagnetic focus of the plasma above the substrate 163A to provide an additional means to control deposition rates. Thus, during or before operation (e.g., when tuning the reactor and/or when depositing a component), the distance ΔL is suitably small relative to L1 and/or L2. For example, the ratio |ΔL|/L1 or |ΔL|/L2 is suitably about 0.5 or less, about 0.2 or less, about 0.1 or less, or about 0.05 or less. In practice, a desirable, tuned value of ΔL is non-zero, and often ΔL<0 during operation.

The disclosed reactor can be provided in the form of a kit that facilitates the selection by a user of specific geometric embodiments. For example, the kit can include a microwave plasma assisted reactor according to any of the disclosed embodiments in conjunction with at least one of: (a) a plurality of cylindrical chambers, each defining an interior cylindrical cavity of a different radius R1; (b) a plurality of bases, each defining an interior base cavity of a different radius R2; and, (c) a plurality of coaxial stages, each having a different radius R3. When the kit includes a plurality of bases, a plurality of appropriately sized quartz bell jars and lower conducting shorts (whether disk-shaped, annular, or otherwise) are also included in the kit. Similarly, when the kit includes a plurality of coaxial stages, a plurality of appropriately sized lower conducting shorts also can be included in the kit (e.g., annular lower conducting shorts should be complementary in size with the individual coaxial stages; however, a single disk-shaped lower conducting short can accommodate the plurality of coaxial stages). A plurality of shim inserts (with the same or different heights) also can be provided in the kit. Thus, the reactor can be assembled with any combination of the cylindrical chambers, the bases, the coaxial stages, and any attendant complementary parts such that at least one of R1, R2, and R3 can be varied in a selected reactor assembly.

Variable-Chamber Reactor Designs

A generalized MCPR can have many separate cylindrical coaxial and cylindrical waveguide sections each with different radii and variable lengths. An example of a generalized reactor design 200, which consists of an input section I and reactor sections S1-S5, is shown in FIG. 2C. Analogous to FIG. 2A, the microwave chamber 10 includes a multi-section and/or variable-radius chamber 220, for example including cylindrical sections 220a, 220b, and 220c which define corresponding reactor sections S2-S4 (e.g., metallic sections with a step-wise (shown), linear, or curved profile transition therebetween). The chamber 220 and its sections 220a-c define an interior cavity 222 with respective radii and heights of R1a, R1b, and R1c and H1a (or L3), H1b, and H1c relative to the central axis A. As shown, the sliding short 140 can have a variable radius design (e.g., also with a step-wise profile as shown) to define the reactor section S1 and the cylindrical cavity 144 with radius R1d and height H1d (or L4) adjacent to the uppermost section of the cavity 222 (e.g., reactor section S2 defined by the cylindrical section 220c as illustrated).

The purpose of each section S1-S5 is (1) to guide and transmit microwave energy to the discharge load, (2) to impedance match the microwave power into the discharge, and (3) to appropriately spatially focus or refocus the microwave energy as it is transmitted through each individual waveguide section. By adjusting the position $Z_s$ of the substrate 163A in sections S4 and S5 above and below the Z=0 plane ($Z_0$; where $Z_s < Z_0$ is below $Z_0$ and $Z_s > Z_0$ is above $Z_0$), the electromagnetic (EM) field in the vicinity of the substrate 163A can be varied (although the electric field is primarily in the axial direction, both Ez and Er electric field components vary as $Z_s$ is varied) to achieve the desired CVD process growth rate and growth uniformity. The choice of the specific configuration (e.g., the number of and the specific lengths of each of the cylindrical waveguide sections) employed in a particular design depends upon on the requirements of the particular application. As is indicated in FIG. 2C, the waveguide section S3 can be further divided into multiple sections, each with a different radius R1b, and length/height H1b, (e.g., i=1 to n, where n is the number of sub-sections for waveguide section S3). In this case, R1b/R1a can be greater than 1 to represent a focusing contraction. In various embodiments, the ratio $R1b_{i+1}/R1b_i$ can be less than or greater than one for adjacent subsections i and i+1 depending on whether the EM energy is being locally focused or defocused by the subsections. Similarly, the (coaxial) waveguide section S2 and the (cylindrical) waveguide section S4 can be further divided into multiple sections, each with a different radius $R1c_i$ or $R1a_i$ and length/height $H1c_i$ or $H1a_i$, respectively (e.g., i=1 to n, where n is the number of sub-sections for the waveguide section). In various embodiments, successive sections $R1c_i$ can be expanding and successive sections $R1a_i$ can be contracting in the direction from $Z_u$ to $Z_0$ to provide desired defocusing or refocusing, respectively, of EM energy passing through the microwave chamber 10.

As used herein, "focused" (or "refocused") and "defocused" are terms indicating a relative increase or decrease, respectively, in the electromagnetic power density of microwave energy in a microwave cavity/chamber, such as between neighboring or adjacent regions of the microwave cavity/chamber. Generally, the microwave energy density becomes focused or refocused as the wave propagates through the microwave cavity/chamber from a region having a relatively larger cross sectional area to a region having a relatively smaller cross sectional area (e.g., a sudden or gradual contraction in cross sectional area, such as in a plane generally perpendicular to a primary direction of propagation of electromagnetic energy in the apparatus). Similarly, microwave energy flux density generally becomes defocused as it propagates through the microwave cavity/chamber from a region having a relatively smaller cross sectional area to a region having a relatively larger cross sectional area (e.g., a sudden or gradual expansion in cross sectional area, such as in a plane generally perpendicular to a primary direction of propagation of electromagnetic energy in the apparatus). For example, in the context of FIG. 2C, microwave energy emanating from the probe 150 is defocused as it propagates from section S2 to S3, and it is focused/refocused as it propagates from section S3 to S4 and into the plasma chamber 180.

A cross section of an embodiment of the more generalized reactor 200 design is shown in FIG. 2D as reactor 210. The internal cavity 222 is cylindrically symmetric about a center z-axis A, and the $Z_0$ plane is identified as the bottom of the reactor 210 and the top of the substrate holder 163 is located in the vicinity of the Z0 plane. The reactor 210 shown in FIG. 21 is divided into five interconnected but distinct cylindrical waveguide sections S1-S5. From the top to the bottom, these are identified as: section S1 which is the coaxial input microwave feed; section S2 which is a length-adjustable coaxial waveguide impedance-matching section of length $L_p$ and radius R1c; section S3 which is a cylindrical waveguide section of length Ls–L3–Lp and of radius R1b; section S4 which is an additional cylindrical waveguide section of radius R1a and length L3; and section S5 which is a variable length, coaxial cavity section with radii R2 and R3 and variable length L2. The probe 150 has a radius Rp and the position of the probe 150 and/or sliding short 140 can be adjusted to select the desired length Lp (e.g., independently adjusted such that Lp and H1c can be the same or different). The length L1 of the cylindrical center conductor of section S5 is also independently variable (e.g., as described above relative to FIGS. 2A and 2B for the sliding short 170). The substrate 163A is placed on the top of the center conductor 163 of section S5 near the $Z_0$ plane. Thus the position $Z_s$ of the substrate 163A is independently variable and is defined by $Z_s$=L1–L2. The center conductor 163 of section S5 also serves as the substrate holder 163 and can be independently externally heated or cooled as described above.

As shown in FIG. 2D, section S1 is the coaxial waveguide input power port. Section (2), the second cylindrical coaxial waveguide section, behaves as an impedance matching section where in practice Lp is often adjusted to be close to a quarter TEM wavelength. In practice, the radial dimensions of this section (R1c and Rp), can be chosen to allow the propagation of a single TEM mode or the propagation of both the coaxial TEM and $TM_{01}$ modes. Section S3 also acts like an impedance matching section and, for this embodiment, the radius R1b is larger than the radii R1d and R1c of sections S1 and S2, respectively (e.g., R1b>R1c>R1d). This causes an EM field intensity redistribution over the waveguide cross section of section S3 and, for a given high input power operation, allows a lower EM power flux density ($W/cm^2$) to be transmitted through the empty waveguide region of section S3 than the power flux density being transmitted through sections S1 and S2. Thus, section S3 defocuses the microwave power as it is transmitted through the reactor 210 preventing at high input powers discharge formation in section S3.

Section S4 also behaves like an additional impedance matching and EM field refocusing section. Since it is desired to create an intense EM field region above the substrate 163A around the $Z_0$ plane and then maintain a discharge in this region at the center axis A of the reactor 210, the EM fields in section S4 are refocused onto the substrate holder 163 location around the $Z_0$ plane. This is accomplished by reducing the radius from R1b in section S3 to R1a of section S4 and then adding the appropriate, additional coaxial waveguide section S5 to the bottom of the applicator 40 enabling a strong electric field to be produced along the central z-axis A at the surface of the substrate 163A while avoiding power discharges in the microwave chamber 10.

Section S5 ($-L \le z \le 0$), behaves as a TEM mode coaxial waveguide section. When excited with 2.45 GHz microwave energy, only the TEM waveguide mode is excited in this section. By adjusting the coaxial cavity lengths L1 and L2 to about 6.12 cm, which is a half TEM wavelength, a standing wave $TEM_{001}$ mode EM field exists in this section and a perpendicular electric field is produced on the surface of the substrate 163A. The substrate position $Z_s$ is further adjusted by slightly varying L1 to position the substrate 163A above or below the $Z_0$ plane as desired.

Another embodiment of the generalized reactor 200 is shown in FIG. 2E as reactor 212 with a contoured, smooth curving wall/section 220b. The individual sections each with a different radii and length are replaced by a wall/section 220b with a continuously varying radius R1b(z). As illustrated, from the top $Z_u$ of the applicator 40 down toward the $Z_0$ plane, the radius R1b(z) first increases and then, as the substrate location $Z_s$ is approached, the radius R1b(z) decreases. Thus, the discrete cylindrical sections shown in FIG. 20 can be replaced with a gradual, continuously varying wall/section of radius R1b(z). The particular variation of R1b(z) depends on the desired EM unfocusing and refocusing that is desired and may be selected based on the specific plasma processing application. As shown, the curved, continuously varying section 220b can be connected to a generally cylindrical section 220a as described above. In other embodiments, the curved section 220b can extend to the base 130 at $Z_0$ of the applicator 40.

Another embodiment of the generalized reactor 200 is shown in FIG. 2F as reactor 214 having two cylindrical sections with radii R1a and R1b (e.g., R1a<R1b as illustrated). As shown in FIG. 2F, the reactor 214 includes five cylindrical waveguide sections: the input section I and reactor sections S1-S4. The illustrate reactor 214 has four mechanically independent cavity applicator 40 adjustments: (1) variable coupling probe 150 length Lp, (2) variable substrate holder 163 length L1, (3) variable top plate sliding short 140 position Ls, and (4) variable lower conducting short plate 170 position L2. These enable process optimization and impedance matching and are varied for discharge control as input power, pressure, gas flow, substrate holder design, etc. are varied.

Reactor Operation

In practice, the plasma loaded applicator is excited with the hybrid $TM_{013}+TEM_{001}$ electromagnetic mode. In order to achieve $TM_{013}$ excitation in the open cylindrical cavity 122, $L_s$ is preferably adjusted/selected to be very close to $3\lambda_g$ 12, where $\lambda_g$ is the guided wavelength of the $TM_{01}$ cylindrical waveguide mode. In order to achieve $TEM_{001}$ excitation in the coaxial section, L2 is preferably adjusted/selected to approximately $\lambda_0 2$, where $\lambda_0$ is the free space wavelength. In general, $\lambda_0$ is based on the relationship $f\lambda_0=c$, where c is the speed of light (e.g., for excitation frequency f=2.45 GHz, $\lambda_0$=12.2 cm; for f=915 MHz, $\lambda_0$=32.8 cm). In practice, $\lambda_g$ is larger than $\lambda_0$ and can be computed as $\lambda_g=\lambda_0(1-(f_c/f)^2)^{-1/2}$, where $f_c$ is the cut-off frequency (and $f > f_c$). Suitable discharge ignition starting lengths for process development are when L1 and L2 are equal to each other and are equal to approximately $\lambda_0/2$. Then, ΔL is zero and the top of the substrate is substantially even with the $Z_0$ plane. Suitable starting lengths for the cylindrical section are $L_s$ of about $3\lambda_g/2$ and the coupling probe depth $L_p$ of about $\lambda_g/4$.

The geometry of the reactor 100 is generally a function of the geometric variables $L_s$, $L_p$, L1, L2, R1, R2, R3, and R4. When these geometric length variables are changed, the electromagnetic fields and the electromagnetic focus in the local region above and around the $Z_0$ plane are controlled and altered. Similarly, when a microwave discharge or plasma is present, the discharge power density, the plasma shape, and the plasma position can be altered by varying one or more of the geometric variables. Thus, a microwave plasma assisted deposition process (e.g., diamond synthesis) also can be changed, controlled, and optimized by changes in the reactor geometry.

When the size and shape of the reactor 100 is varied, for example by changing the various reactor radii or lengths, the reactor can be optimized for a specific deposition process. In practice R1 is determined primarily by the choice of the excitation frequency Generally, a range of R1 values can be used, ranging from a minimum R1 for the $TM_{013}$ mode to exist and some maximum R1 at which a distinct $TM_{013}$ mode is difficult to obtain due to many other modes having a similar $L_s$ value, and R2 and R3 are then determined by the specific process application (e.g., desired substrate size, operating pressure regime). For example, for low pressure, large-area operation and low discharge power density, R2 and R3 take on lengths that are slightly smaller than R1. Some reactor designs often fix the applicator radii, and then, during process optimization, the electromagnetic field patterns and associated microwave discharge are modified by varying L1, L2, $L_s$ and $L_p$ as well as pressure and input microwave power. This is a multivariable optimization procedure that is initially performed by the operator during process development and after some experience it can also be performed automatically via a preprogrammed recipe. Since there are many variables, there are many possible shapes, positions, and intensities that the discharge can assume in the vicinity of the $Z_0$ plane, and all of these are available for process optimization.

The reactor 100 in any of its embodiments can be operated in a process to deposit a component (e.g., single-crystal diamond, polycrystalline diamond) on the substrate 163A mounted or otherwise located above the coaxial stage 160 (e.g., on the substrate holder 163). The specific construction of the substrate 163A is not particularly limited and can be suitably selected based on the particular component being deposited. For example, single-crystal diamond can be deposited on a single-crystal seed substrate (e.g., high-pressure, high-temperature single-crystal seed), and polycrystalline diamond can be deposited on a silicon-based substrate (e.g., nucleation-seeded silicon, doped silicon, or silicon nitride). Polycrystalline diamond can include both nanocrystalline diamond (e.g., crystals on the order of nanometers to hundreds of nanometers) and microcrystalline diamond (e.g., crystals on the order of micrometers to hundreds of micrometers).

The reactor 100 is operated by applying power to the excitation probe 150 to generate electromagnetic waves at a selected frequency. For example, applied powers ranging from about 1 kW to about 10 kW (e.g., about 2 kW to about 3 kW or about 4 kVV) are suitable for a 2.45 GHz frequency, and applied powers ranging from about 5 kW to about 30 kW are suitable for a 915 MHz frequency. Based on the reactor 100 geometry and depending on the particular selection of characteristic length scales, a first electromagnetic mode M1 (e.g., $TM_{013}$) can be excited in the cylindrical chamber 122 of the reactor 100 and a second electromagnetic mode M2 (e.g., $TEM_{001}$) can be excited in the coaxial chamber 166 of the reactor 100, thereby forming a hybrid electromagnetic mode M3 in the plasma chamber 20. This "hybrid mode" has field patterns that are predominantly $TM_{013}$ in the cylindrical chamber and $TEM_{001}$ in the coaxial chamber. The two electromagnetic field patterns interact at the discontinuous $z=Z_0$ boundary plane. The abrupt physical discontinuity at the $Z_0$ plane sets up local evanescent fields on either side of the plane and the total field in the vicinity of the deposition substrate 163A (i.e., the impressed electromagnetic field that creates and sustains the plasma) is the sum of the two modes M1 and M2 plus the induced evanescent field.

The impressed substrate field can be varied by spatially changing the evanescent field around the discontinuity plane by varying the various dimensions such as R1, R2, R3 L1, and L2, etc. Thus by changing these dimensions, the electromagnetic focus at the substrate is varied. For example if R3 is reduced and L1 and L2 are approximately equal to one half of the free space wave length, then the field at the end of the substrate holder will be intense and mainly perpendicular to the top of the substrate. If L1 and L2 are then varied slightly, the field then has additional inward or outward directed radial components, there by changing the total impressed field pattern. If R3 and R4 are large (i.e., with respect to R2) then the impressed field pattern is reduced, but is more uniform over a larger radius, there by producing a more uniform plasma and a more uniform deposition over the larger substrate area. Thus, it is clear that a large variety of impressed electromagnetic field patterns can be created in the vicinity of the substrate by adjusting the reactor dimensions. Given a specific microwave plasma assisted CVD application, the reactor dimensions and tuning can be adjusted to optimize a specific process.

A source gas is fed to the interior cavity 182 of the plasma chamber 20 at a selected operating pressure to form a plasma 184 when power is being applied. The particular operating pressure in the plasma chamber 20 can range between about 10 Torr and 760 Torr and can be suitably controlled by the vacuum pump 194 and/or by source gas flow rates. The operating pressure is desirably increased, however, to increase the deposition rate of the component on the substrate 163A. For example, operating pressures of at least about 100 Torr, 150 Torr, 180 Torr, 200 Torr, or 220 Torr and/or up to about 300 Torr, 350 Torr, 400 Torr, 500 Torr, or 760 Torr can be selected in various embodiments. More particularly, suitable pressures at a 915 MHz frequency can range from about 100 Torr to about 160 Torr (e.g., when the substrate 163A ranges from about 10 cm to about 14 cm in size/diameter) or from about 20 Torr to about 100 Torr (e.g., when the substrate 163A ranges from about 14 cm to about 20 cm in size/diameter). Suitable pressures at a 2.45 GHz frequency can range from about 50 Torr to about 150 Torr (e.g., when the substrate 163A ranges from about 6 cm to about 9 cm in size/diameter). Alternatively, pressures at a 2.45 GHz frequency can range from about 100 Torr to about 400 Torr, about 180 Torr to about 260 Torr, or about 220 Torr to about 260 Torr (e.g., when the substrate 163A is up to about 6 cm or up to about 3 cm in size/diameter).

The particular source gas(es) fed to the plasma chamber 20 will depend on the particular deposition component. For diamond deposition, a mixture of methane ($CH_4$) and hydrogen ($H_2$) is suitable. The feed composition is generally expressed as a mol. % (or vol. %) of methane relative to hydrogen. For example, feed compositions of at least about 1 mol. % $CH_4$, 2 mol. % $CH_4$, or 3 mol.% $CH_4$ and/or up to about 5 mol. % $CH_4$, 6 mol. % $CH_4$, 8 mol. % $CH_4$, or 10 mol. % $CH_4$ can be selected in various embodiments. In some embodiments, the source gas can further include nitrogen ($N_2$) to increase the diamond deposition rate. Suitable nitrogen feed concentrations can range from about 0.0005 mol. % N2 or 0.005 mol. % N2 to about 2 mol. % $N_2$ relative to the hydrogen feed. Other source gases may be incorporated as desired to add desired dopants, for example including diborane ($B_2H_6$; to form boron-doped diamond). In yet other embodiments, an inert carrier gas (e.g., argon) can form the bulk of the source gas with desired levels of methane, hydrogen, etc. added to the carrier gas.

The process further includes adjusting the axial position of the lower conducting short 170 and/or the coaxial stage 160 of the reactor 100 to selectively position the electromagnetic focus of the plasma 184 above the substrate 163A during operation. The axial position adjustments can be made prior to operation of the reactor 100. For example, the lower conducting short 170 and the coaxial stage 160 can be set to their desired axial positions after which the reactor 100 can be powered on to execute a brief ignition step and then to perform a continuous deposition process according to the foregoing parameters. Alternatively or additionally, the lower conducting short 170 and the coaxial stage 160 can be set to their desired axial positions during the operation of the reactor 100 (e.g., using the structure illustrated in FIG. 2A to adjust the lower conducting short 170 and the coaxial stage 160 without needing to disassemble or otherwise access the plasma chamber 20 and the vacuum chamber 30).

The axial position adjustments can form the basis for a more general reactor tuning process. Specifically, a plurality (e.g., two or more) of combinations of L1 and L2 can be selected to identify favorable/optimum deposition properties (e.g., power density, substrate temperature, deposition rate, deposition uniformity) at a selected set of other operating parameters (e.g., operating pressure, source gas composition, applied power, coaxial stage radius (or other geometric parameters)). For example: L1 is held constant and L2 is parametrically varied over a plurality of values, L2 is held constant and L1 is parametrically varied over a plurality of values, or L1 and L2 are both parametrically varied over a plurality of values. Such parametric variation can be expressed in terms of a plurality of ΔL values that are individually tested (e.g., a plurality of ΔL/L1 or ΔL/L2 values ranging from about −0.5 to about 0.5, about −0.2 to about 0.2, about −0.1 to about 0.1, or about −0.05 to about 0.05). The tuning process is completed by operating the reactor 100 at each of the plurality of L1 and L2 (or ΔL) combinations and then measuring or otherwise characterizing one or more deposition properties resulting from each individual tuning selection. Deposition properties can be measured at each combination of L1 and L2, and a specific set of L1 and L2 values (or the tuned L1 and L2 values) can be selected as that which maximizes or otherwise optimizes the reactor operation in terms of one or more deposition properties. For example, it is generally desirable to maximize the power density and/or the deposition rate, and such maximization can be constrained by a desire to simultaneously maintain the substrate temperature and/or the deposition uniformity within or under a specific range based on safety and/or quality considerations.

While the tuning process generally applies to the selection of favorable/optimum geometric parameters for reactor operation, other operating conditions can be parametrically varied over a plurality of values in addition to the plurality of L1 and L2 values as part of the tuning process. For example, the operating pressure and/or the source gas composition can be varied to characterize their influence on one or more deposition properties.

The particular selection of geometric reactor parameters (e.g., coaxial stage 160 radius R3, coaxial stage 160 distance L1, lower conducting short 170 distance L2) permits operation of the reactor 100 under conditions that result in favorable/optimum properties of deposition process and/or resulting deposition film. Particular deposition properties of interest include applied power density, substrate temperature, deposition rate, and deposition uniformity. Thus, the reactor 100 is preferably capable of obtaining any combination of the foregoing deposition properties during operation, for example including deposition property values within the following ranges.

The power density (or discharge power density) is the absorbed microwave power divided by the plasma 184 volume. A relatively high power density is desirable as it generally leads to higher component deposition rates. In various embodiments, the power density is suitably at least about 50 $W/cm^3$, 100 $W/cm^3$, 120 $W/cm^3$, 160 $W/cm^3$, or 200 $W/cm^3$ and/or up to about 500 $W/cm^3$, 600 $W/cm^3$, 700 $W/cm^3$, 800 $W/cm^3$, 900 $W/cm^3$, 1000 $W/cm^3$, or 2000 $W/cm^3$.

During deposition, the temperature uniformity across the substrate 163A correlates with the size of the plasma 184. At low microwave powers, the plasma 184 may not completely cover the substrate 163A, leading to incomplete and/or non-uniform deposition. At higher microwave powers, the plasma 184 may expand in size to the point that it begins excessively heating the quartz bell jar 180. Thus, the substrate temperature uniformity and quartz bell jar temperature are preferably monitored and controlled during operation of the reactor 100 to achieve desired substrate temperature and substrate temperature uniformity without overheating the quartz bell jar (e.g., via the coolant 165A internal to the coaxial stage 160 and/or by adjusting the applied input power and/or operating pressure). For example, in a 2.45-GHz reactor and at elevated operating pressures of interest, the substrate temperature suitably ranges from about 1000° C. to about 1200° C., about 1050° C. to about 1200° C., or about 1100° C. to about 1200° C.

The deposition rate is suitably expressed as an integral property of the deposition process (i.e., total deposited (average) film thickness divided by the total deposition time, for example in microns per hour) and is desirably maximized to increase process throughput. In various embodiments, the deposition rate is suitably at least about 2 µm/h, 3 µm/h, 6 µm/h, 10 µm/h, 12 µm/h, or 15 µm/h and/or up to about 20 µm/h, 25 µm/h, 30 µm/h, 40 µm/h, 50 µm/h, 75 µm/h, 100 µm/h, or 150 µm/h (e.g., with the optional introduction of a nitrogen source gas) in particular for single crystal diamond and (microcrystalline) polycrystalline diamond. Deposition rates for nanocrystalline diamond are often lower, for example being at least about 50 nm/h or 100 nm/h and/or up to about 200 nm/h or 500 nm/h.

The deposition non-uniformity is desirably small so that the physical properties of the resulting film will be relatively homogeneous, regardless of how the resulting film is used in a practical setting. The deposition uniformity can be expressed as the percent relative deviation of the deposited component's film thickness measured at multiple (e.g., three or more) spatial locations (e.g., circumferential and/or radial locations) in the film. As reported herein, the deposition uniformity is the percent difference between the maximum and minimum measured thicknesses normalized to the average film thickness. In various embodiments, the deposition uniformity is suitably up to about 15%, 10%, 5%, or 3%. While the deposition uniformity is desirably as small as possible, process variability can result in deposition uniformities of at least about 0.1%, 0.2%, 0.5%, or 1%.

Additional details relating to the disclosed subject matter are described in the examples below. U.S. Pat. Nos. 8,316,797, 8,668,962, U.S. Publication No. 2010/0034984, and International Publication No. WO 2012/173207 are incorporated herein by reference and they describe various suitable reactor geometries (e.g., microwave chambers with one or more cylindrical wall sections and/or variable-radius wall sections, axially adjustable conductive stages providing variable substrate positioning during deposition, axially adjustable upper microwave chamber boundaries and EM wave sources permitting internal cavity matching, reactor dimensions) and operating conditions (e.g., gas flow rates, feed gas compositions, microwave excitation frequencies, microwave excitation input powers, substrate temperatures, generated EM modes, operating pressures, reactor power densities, etc.).

Methods of Operation

Figure 4:
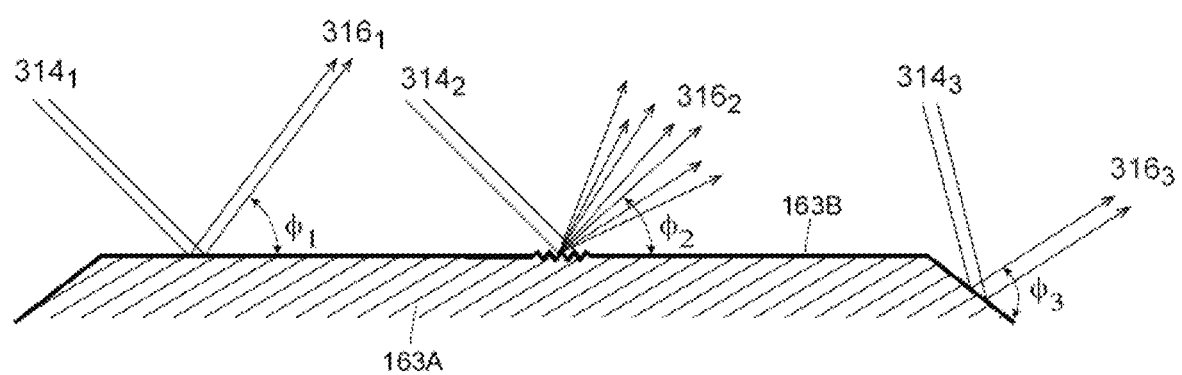
FIG. 4 is a cross sectional view of substrate structure receiving incident light and transmitting reflected and scattered light.
Figure 5:
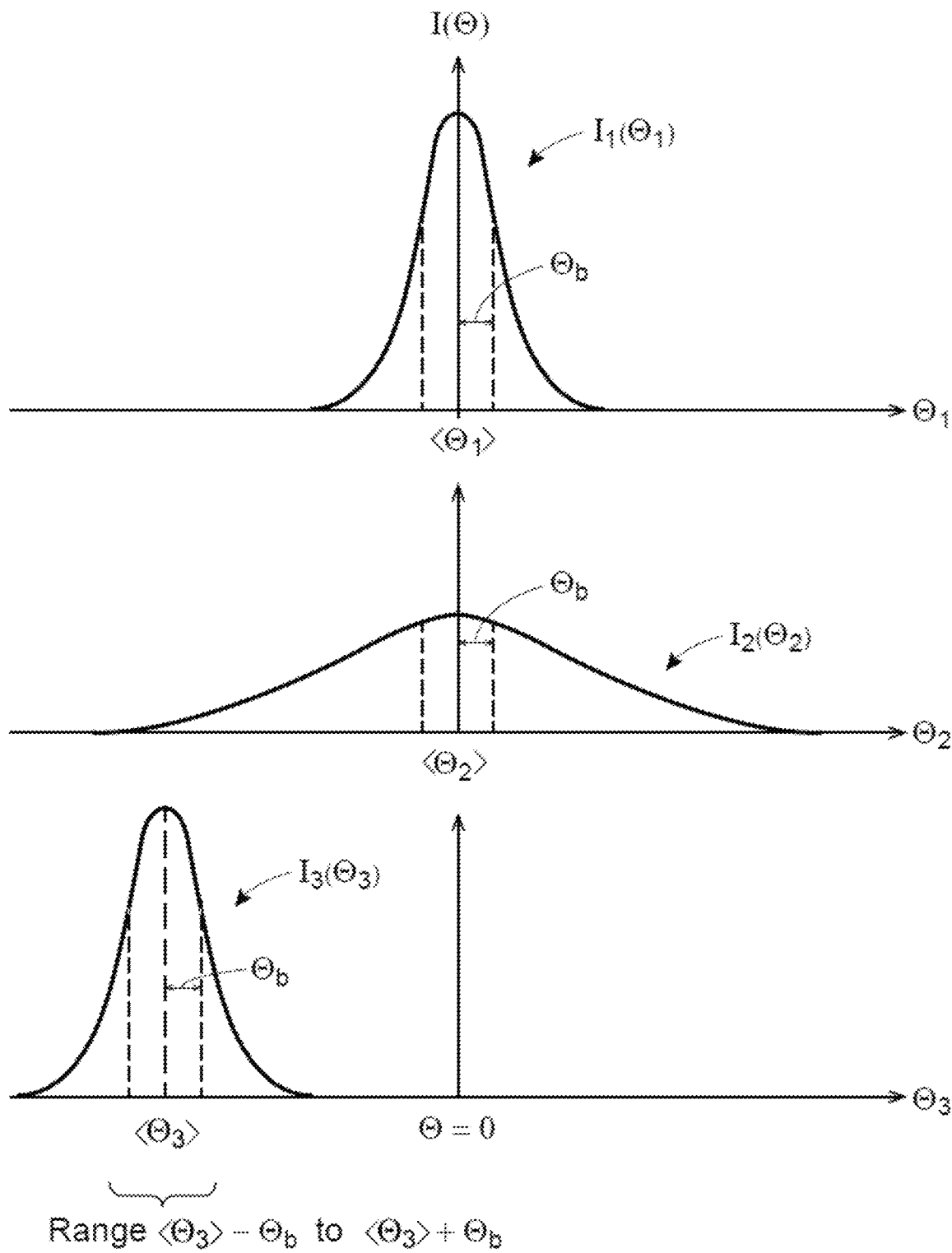
FIG. 5 is a graph illustrating the determination of reflected light, scattered light, and average substrate surface angle from an optical measurement according to the disclosure.

The reactor apparatus and related systems disclosed herein can be used in various processes for depositing a component (e.g., diamond) on a substrate while measuring real-time light reflection and/or scattering data, which data can be used to characterize the substrate as it grows with the deposited component and/or to make decisions or otherwise take action controlling future process steps. FIGS. 3A-3J illustrate cross sectional views of various substrate structures that can develop during component deposition and growth (e.g., via CVD diamond deposition). FIG. 4 is a cross sectional view of substrate structure receiving incident light and transmitting reflected and scattered light. FIG. 5 is a graph illustrating the determination of reflected light, scattered light, and average substrate surface angle from an optical measurement according to the disclosure.

A general process for depositing a component on a substrate according to the disclosure and using the reactor 100 in any of its various disclosed embodiments (e.g., further including the substrate 163A positioned on the stage reference surface 163, which could be a substrate holder portion of the stage) generally includes (1) operating the reactor 100 at a temperature and pressure sufficient to deposit a component on the substrate 163A, (2) operating the coherent light source 310 to direct an incident beam 314 of coherent light (e.g., with the steerable mirror 320 if present or without if not) through the first region 340A and onto the substrate 163A (e.g., via the internal volume 122 and into the plasma chamber 20), thereby forming reflected and/or scattered light 316, 318 from the substrate 163A while the component is being deposited; and (3) receiving at the detection means 330 an incident distribution of the reflected and/or scattered light 316, 318 from the substrate 163A and passing through the second region 340B. In many embodiments, the incident position of the light source 310 beam 314 is varied during operation to allow scanning and measurement of different regions of the substrate 163A as a function of time during deposition. Direction of the incident beam 314 to the desired location on the substrate 163A can be performed by orienting or otherwise moving the steerable mirror 320 (when present) and/or the light source 310 itself (e.g., when mounted on a moveable support).

The foregoing steps are generally performed concurrently, although in some cases activation of the light source 310 and measurement of the corresponding reflected and/or scattered light 316, 318 with the detection means 330 can be performed intermittently during an otherwise continuous deposition process while the reactor 100 is in operation. While it is generally possible to continuously scan the substrate 163A surface (e.g., by continuously traversing different areas of the surface with the incident beam 314 while scanning), the deposition process is generally slow enough that intermittent scanning is sufficient to characterize the substrate 163A growth. For example, scanning of the (complete) substrate 163A surface can be performed once every 5 min, 10 min, or 15 min to 10 min, 15 min, 20 min or 30 min, where scanning of the complete substrate 163A surface could require about 1 min to 3 min (e.g., depending on substrate 163A size, etc.). After measurement of light intensity data for a given scan and before the next scan, the data can be used to calculate desired surface features of the substrate 163A (e.g., angles, roughness, area as described below). This surface feature data can then be displayed to the deposition reactor 100 operator and/or used in a closed loop feedback control system.

The incident beam 314 of coherent light generally has a surface area ranging from about 0.5 $mm^2$, 0.75 $mm^2$, or 1 $mm^2$ to 1 $mm^2$, 2 $mm^2$, or 5 $mm^2$ on the substrate 163A, which in turn corresponds the spatial resolution of the resulting light intensity measurements. The surface area of the incident beam 314 generally corresponds to a emitted light beam 312 of (circular) diameter of about 0.4 mm, 0.7 mm, or 1 mm to 1.5 mm, 2 mm, or 2.5 mm, which has a projected area on the substrate 163A of a corresponding generally circular or elliptical shape (e.g., depending on the incidence angle). In some cases, even larger-diameter incident beam 314 and/or correspondingly larger incident surface areas can be selected to provide an integral or average representation of various substrate 163A surface properties (e.g., average surface roughness over a relatively large fraction of the substrate 163A top surface area).

The deposited component is suitably diamond, for example single-crystal diamond (SCD). In some embodiments, the deposited component can include polycrystalline diamond (PCD), including nanocrystalline and ultrananocrystalline diamond, as a desired deposition component, in which case the light intensity measurements described herein can provide a representative measure of surface roughness for the growing PCD.

FIGS. 3A-3J illustrate cross sectional views of various substrate structures that can develop during component deposition and growth, for example in the particular illustrative example of diamond deposition using a reactor 100 according to the disclosure. As the diamond is deposited onto the substrate 163A, the top surface 163B of the diamond substrate 163A evolves such that the substrate 163A gets thicker and the top surface 163A may take on any of the illustrative structural features illustrated in the figures. The disclosed light reflection/scattering technique is capable of obtaining real-time information on the qualitative and/or quantitative shape of the diamond top surface 163A during the diamond deposition process.

Figure 3A:
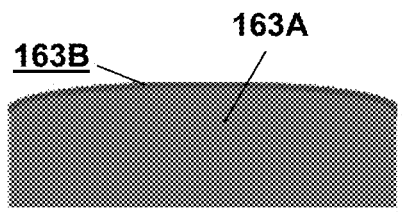
FIG. 3A is a cross sectional view of substrate structure developed during growth (e.g., via CVD diamond growth) and having a concave upper surface.

FIG. 3A illustrates a substrate 163A that has a concave top surface 163B (i.e., higher in the center) with a smooth curvature. This type of top surface 163B can occur when the growth is occurring slightly faster in the center. This type of top surface 163B often produces some of the best CVD grown diamond. However, the height of the center is suitably not too high in comparison to the edges, or the edges might not continue to grow properly.

Figure 3B:
FIG. 3B is a cross sectional view of substrate structure developed during growth (e.g., via CVD diamond growth) and having an alternate embodiment of a concave upper surface.

Similar to FIG. 3A, FIG. 3B illustrates a substrate 163A that has also a concave top surface 163B, but with discontinuous transitions between regions with different slopes. Such growth can be similarly desirable as the structure in FIG. 3A, and growing substrates 163A often can include a combination of curved and flat (but sloped) surfaces 163B illustrated in FIGS. 3A and 3B.

Figure 3C:
FIG. 3C is a cross sectional view of substrate structure developed during growth (e.g., via CVD diamond growth) and having a convex upper surface.

FIG. 3C illustrates a substrate 163A that has a convex top surface 163B (i.e., lower in the center) with a smooth curvature. This top surface 163B can form when the diamond deposition rate at the edges of the substrate 163A is faster than in the center. This type of growth often results in polycrystalline diamond ultimately growing on the edges of the substrate 163A, which is an undesirable result. Polycrystalline diamond can grow inwards towards the center of the substrate 163A leading to defects and stress. This is an undesirable top growth surface.

Figure 3D:
FIG. 3D is a cross sectional view of substrate structure developed during growth (e.g., via CVD diamond growth) and having an alternate embodiment of a convex upper surface.

Similar to FIG. 3C, FIG. 3D illustrates a substrate 163A that has also a convex top surface 163B, but with discontinuous transitions between regions with different slopes. Such growth can be similarly undesirable with the formation of polycrystalline diamond as the structure in FIG. 3C, and growing substrates 163A often can include a combination of curved and flat (but sloped) surfaces 163B illustrated in FIGS. 3C and 3D (although the FIG. 3C embodiment is more common).

Figure 3E:
FIG. 3E is a cross sectional view of substrate structure developed during growth (e.g., via CVD diamond growth) and having a convex upper surface with polycrystalline growths at the periphery.

FIG. 3E illustrates a substrate 163A that can result when a convex substrate 163A such as that shown in FIGS. 3C and 3D is allowed to continue to grow and polycrystalline diamond eventually forms on the edge as a relatively rough local surface. It is desirable to be able to detect when such structure begins to occur (e.g., by measuring an onset or increase in local surface roughness at the substrate 163A periphery) so that the deposition process can be stopped as needed. The edges of substrates 163A with such polycrystalline diamond present have internal stresses and cracking of the grown diamond becomes more probable.

Figure 3F:
FIG. 3F is a cross sectional view of substrate structure developed during growth (e.g., via CVD diamond growth) and having a partially convex and a partially concave upper surface.

FIG. 3F illustrates a substrate 163A that has an asymmetry (e.g., a general, if not constant, slope to one direction) that could develop if the substrate 163A is not sitting well in a substrate holder recess pocket that holds the substrate 163A. Alternatively, the substrate 163A can actually be cut on the right side (for example, as illustrated in the figure) at a particular slope so that the extended defects in the substrate 163A are steered away from the top surface 163B and towards the edges of the substrate 163A.

Figure 3G:
FIG. 3G is a cross sectional view of substrate structure developed during growth (e.g., via CVD diamond growth) and having upper surface defects.

FIG. 3G illustrates a substrate 163A that has developed surface 163B defects (regions) that are either pyramids sticking out the surface, pyramids sticking into the surface, partially formed pyramids, or other randomly shaped defects (e.g., pits or protrusions) on the surface 163B. In this case, it is desirable to be able to detect when such structure begins to occur and to what extent they are occurring. In some cases, this information could be used to stop the deposition run. In other cases, formation of twins in the crystal structure may be occurring and a change in the deposition conditions may allow the twins to be overgrown and a smooth surface 163B regained.

Figure 3H:
FIG. 3H is a cross sectional view of substrate structure developed during growth (e.g., via CVD diamond growth) and having a sloped upper surface.

FIG. 3H illustrates a substrate 163A that has been purposely cut at an angle off the crystallographic plane in the substrate. For example, by having the top surface 163B at an angle of a few degrees (e.g., at least 1 or 2 and/or up to 4 or 5 degrees) off the (100) crystallographic plane, the resulting deposition can be improved. For example, the incorporation of a dopant may be improved, the deposition surface 163B may be smoother, and/or the start of extended defects may be decreased.

Figure 3I:
FIG. 3I is a cross sectional view of substrate structure developed during growth (e.g., via CVD diamond growth) and having a laterally extending upper surface during growth.

FIG. 3I illustrates a substrate 163A that is grown under conditions such the edges of deposited diamond are extending laterally. This could be useful for making the substrate 163A slightly bigger as time progresses.

Figure 3J:
FIG. 3J is a cross sectional view of substrate structure developed during growth (e.g., via CVD diamond growth) and having a terraced upper surface.

FIG. 3J illustrates a substrate 163A in which various surface 163B textures on can develop on a microscopic scale. Sometimes the surface 163B has a terraced aspect or sometimes an orange peel-type aspect. Knowledge of the surface microscopic structure is useful for characterizing the growth quality and nature of the diamond being deposited.

As generally described herein, reflected and scattered light 316, 318 from the surface 163B is projected onto the detector 330 such as a focal plane array (essentially a digital camera detector without a lens). If the surface 163A is very smooth, the information obtained by the location of the light 316, 318 on the detector 330 is the angle of the top surface 163B where the incident beam 314 is reflecting relative to a horizontal flat surface. By using the steering mirror 320 (for example) to scan the beam 314 across the surface 163A, the angle of the top surface 163B relative to a flat horizontal surface (or other) reference plane can be obtained. A representative size of the beam 314 spot size is about 1 mm, which generally corresponds to the resolution of the top surface 163B topology measurement. If the surface 163B of the substrate 163A is rough on a small scale less than the incident area of the beam 314 spot size on the substrate 163A, the resulting light 316, 318 will be scattered in addition to the primary reflection. The intensity and direction of the scattered light 318 measured by the focal plane array provides information about the microscopic nature of the surface 163B. Of particular importance is the evolution of the reflected/scattered light 316, 318 as the diamond is deposited. The angle of the top surface 163B, the variation of the top surface 163B among the different structures illustrated in FIGS. 3A-3J (for example), and relative amount of scattered light 318 all can change as the diamond grows. Having real-time information on the evolution of the surface 163B as the substrate 163A grows permits feedback to be used to adjust the deposition process during growth.

FIG. 4 illustrates representative incident and reflected/scattered light paths that could be observed for a substrate 163A having various different shape, roughness, or slope characteristics on its upper surface 163B. In a first representative measurement, incident light beam $314_1$ reflects off of a substantially smooth and flat (e.g., parallel to the reference stage 163 and/or reference plane $Z_0$) portion of the upper surface 163B corresponding to the coherent light interrogation surface area, resulting in a reflected light beam $316_1$ including plurality of reflected rays that are substantially parallel and that all have substantially the same reflection angle $\phi_1$.

In a second representative measurement, incident light beam $314_2$ reflects off of a substantially rough (e.g., a plurality of small protrusions as illustrated) but generally flat (e.g., parallel to the reference stage 163 and/or reference plane $Z_0$) portion of the upper surface 163B corresponding to the coherent light interrogation surface area, resulting in a reflected light beam $316_2$ including plurality of reflected rays that are generally not parallel to each other and that have a substantially broad distribution of reflection angles $\phi_2$. As illustrated, individual incident rays can reflect at a variety of different angles based on the local surface shape at the point of incidence. The plurality of light rays having different reflection angles, once measured by the detection means 330, would be interpreted as having a substantial component of scattered light 318 as well as some reflected light 316 (e.g., as shown in FIG. 1A).

In a third representative measurement, incident light beam $314_3$ reflects off of a substantially smooth but sloped (e.g., sloped relative to the reference stage 163 and/or reference plane $Z_0$) portion of the upper surface 163B corresponding to the coherent light interrogation surface area, resulting in a reflected light beam $316_3$ including plurality of reflected rays that are substantially parallel and that all have substantially the same reflection angle $\phi_3$. Relative to the first scenario, the third scenario has a similarly narrow distribution of reflection angles (i.e., because both regions of the surface 163B are substantially smooth), but the magnitudes (e.g., averages of the distribution) of the two reflection angles are generally differentiable based on the different slopes of the two regions (e.g., $\phi_1 \neq \phi_3$).

FIG. 5 illustrates representative light intensity distribution measurements of reflected/scattered light from the substrate 163A upper surface 163B as a function of surface angle $\theta$ for the three representative incident beams 314 illustrated in FIG. 4. The local surface angle $\theta$ of the upper surface 163B can be represented by angle $\theta(x, y, t)$, where x and y are the spatial coordinates of the measurement (e.g., as measured in any suitable reference plane defined by the substrate, substrate holder, stage reference surface, etc.) and t is the deposition time. Similarly, $<\theta>$ is the average angle of the upper surface 163B over the interrogation area of the incident laser beam. The angles $\theta$ and $<\theta>$ can be defined relative to any desired reference plane, for example a horizontal reference plane defined by the substrate holder, stage reference surface, reactor reference plane $Z_0$, etc. For example, relative to such a horizontal reference plane and with reference to FIG. 4, $(\theta_1)$ and $(\theta_2)$ for the first two representative scattering measurements are qualitatively both essentially zero, because they are both essentially flat horizontal surfaces on average (i.e., even though one is a smooth and the other is a rough surface). Similarly, relative to the same horizontal reference plane and with reference to FIG. 4, $(\theta_3)$ for the third representative scattering measurement is qualitatively less than zero, because it is angled downward and away from the horizontal reference plane. The detector 330 measures light intensity as a function of position on its detector surface. Accordingly, the particular location of a light intensity measurement on the detector surface can be used in combination with conventional optics calculation techniques and knowledge of the system 300/reactor 100 geometry (e.g., physical location of components for ray path determination based on reflection, refraction, etc.) and structure (e.g., materials for components such as optical windows for index of refraction values) to determine the corresponding reflection angle $\phi$ and surface angle $\theta$ for each light intensity measurement. Although FIG. 4 is illustrated as a two-dimensional cross-section, the reflection angle $\phi$ and surface angle $\theta$ are not restricted to any particular measurement plane(s) relative to the incident beams 314, because the measured light scattering signal on the detector 330 is generally in the form of a two-dimensional image able to determine angles $\phi$ and $\theta$ relative to the incident beams 314 for any substrate 163A shape and/or orientation.

In general, due primarily to scattering from surface irregularities on the upper surface 163B, light intensity measurements on the detector surface typically will be distributed across multiple locations of the detector surface and at differing intensities at different locations. For example, as illustrated in FIG. 5, the incident light reflected and scattered light 316, 318 on the detector 300 surface (e.g., focal plane array or otherwise) can be represented by a light intensity distribution function $I(\theta(x, y, t))$. As described above, the reflection angle $\phi$ can be determined from conventional optics calculations and the corresponding surface angle $\theta$ can be determined from the reflection angle $\phi$ (e.g., based on knowledge of the substrate, substrate holder, reference stage geometry and location, etc.). When there is a relatively low degree of scattering of light from the upper surface 163B and most of the detected light is from reflected light 316, a relatively tall and narrow $I(\theta)$ is observed. Conversely, when there is a relatively high degree of scattering of light from the upper surface 163B and most of the detected light is from scattered light 318, a relatively short and wide $I(\theta)$ is observed. With a measured light intensity distribution $I(\theta)$ at a given time and location, an average local surface angle $(\theta)$ of the substrate 163A at the time and location can be determined as the peak of the light intensity distribution $I(\theta)$.

The light intensity distribution $I(\theta)$ at a given time and location also can be used to characterize a corresponding local surface roughness of the substrate 163A, where a larger degree of scattering is characterized by a shorter, flatter, wider distribution as described above. For example, given knowledge of the diameter of the coherent light beam 312, a central portion of the distribution $I(\theta)$ between $<\theta>-\theta_b$ and $<\theta>+\theta_b$ can be attributed to reflection, and the remaining outer tail portions of the distribution can be attributed to rough surface scattering, where $\theta_b$ is the angle corresponding to the half-width of the beam 312. An integral of the intensity distribution $I(\theta)$ for the reflected light (e.g., $\int I(\theta)d\theta$ between $<\theta>-\theta_b$ and $<\theta>+\theta_b$) relative to an integral of the intensity distribution $I(\theta)$ for the total reflected and scattered light (e.g., $\int I(\theta)d\theta$ over all $\theta$) can be used to represent surface roughness on a scale of 0 to 1, where 0 represents complete scattering from a very rough local surface area and 1 represents complete reflection from a very smooth local surface area.

FIG. 5 illustrates representative light intensity distribution $I(\theta)$ measurements of reflected/scattered light as well as the corresponding average and width/roughness parameters determined therefrom. The three illustrated distributions $I_1(\theta_1)$, $I_2(\theta_2)$, and $I_3(\theta_3)$ of light from the substrate 163A upper surface 163B as a function of surface angle $\theta$ correspond to the three representative incident beams $314_1$, $314_2$, and $314_3$ and reflection angles $\phi_1$, $\phi_2$, and $\phi_3$ illustrated in FIG. 4. The first and third distributions $I_1(\theta_1)$ and $I_3(\theta_3)$ represent mostly reflection from a smooth surface, so they have similarly shaped tall and narrow distributions with similar widths (i.e., corresponding to mostly reflection from a smooth surface) but with different average/peak values (i.e., corresponding to different average local surface angles at the point of measurement). The second distribution $I_2(\theta_2)$ represents mostly scattering from a rough surface, so it has a short and wide distribution relative to $I_1(\theta_1)$ and $I_3(\theta_3)$. The first and second distributions $I_1(\theta_1)$ and $I_2(\theta_2)$ have similar average/peak values (i.e., corresponding to similarly flat average local surface angles at the point of measurement in this illustrative case) even though their distribution widths are different as a result of differing surface roughness.

The intensity distribution $I(\theta)$ measurements as well as the corresponding average and width properties of the distribution can be used to characterize the substrate 163A in a variety of additional ways. For example, local surface 163B curvature of the substrate 163A can be determined my measuring the intensity distribution $I(\theta)$ at multiple different local interrogation points on the substrate 163A and determining the average local surface angle $<\theta>$ of the substrate 163A and optionally the local surface roughness of the substrate 163A at the different local interrogation points to determine a local surface curvature of the substrate 163A. A spatial gradient of the average local surface angle $<\theta>$ is a suitable means for characterizing local surface curvature. Given knowledge of local surface curvature, it can be determined whether the substrate 163A has a locally convex surface, has a locally concave surface, is maintaining a target surface slope during growth, etc., along with the attendant advantages or disadvantages associated therewith as generally described in relation to FIGS. 3A-3J. Similarly, if local surface roughness is determined from the intensity distribution $I(\theta)$ measurements, it can be further determined where local surface defects have developed, for example polycrystalline diamond, pyramids or other pits/protrusions, a terraced structure, etc. as generally described in relation to FIGS. 3A-3J. Detection of local surface roughness can be used in a feedback loop to select changes in operating conditions that reduce surface roughness. For example, by changing methane feed percentage or substrate temperature, one may be able to grow back to a smooth surface. Measurement of the local surface angle $<\theta>$ over time can further be used to determine any growth in surface area of the substrate over time (e.g., as specifically illustrated in FIG. 3I). For example, the incident beam 312 can be scanned to detect the edges of the substrate 163A (e.g., scanning the substrate 163A at increasingly farther positions from its center until the reflection/scattering signal disappears, thus indicating the presence of the substrate edge boundary at a given time).

The information on the surface shape and microstructure can be used for feedback for the diamond deposition process. A primary feedback parameter used during a diamond deposition run is the temperature of the substrate. A common way this information is used is that the microwave input power is adjusted to maintain the substrate surface temperature in specific range (e.g., locally and/or globally across the substrate). The additional surface shape/topographical information regarding growing substrate surface from light reflection/scattering can be used for a number of feedback purposes during the run including:

(1) Determining when to stop a run if the diamond is not depositing correctly. Examples for this include when the surface is growing faster at the edges than in the center, polycrystalline diamond is growing on the edges, and/or the surface becomes too defective in general (e.g., a rough surface with many protrusion/pit surface irregularities).

(2) Controlling of the input variables to the diamond deposition process to get a certain surface topology. The input variables that can be adjusted include substrate position, substrate temperature, distance from plasma discharge, position of the substrate in the pocket recess of the substrate holder, input microwave power, methane concentration in the feedgas, and/or pulsing of the microwave power.

(3) Maintaining a desired angle of the top surface to steer extended defects (e.g., dislocation defects) towards the edge of the substrate.

(4) Having knowledge that the surface is starting to form crystal twins during growth. If the surface is starting to exhibit crystal twin formation, the growth conditions can be adjusted to reduce/prevent the twin formation.

(5) Having knowledge of formation of surface defects on approximately a 1 $mm^2$ size spatial resolution. It is useful to know how quickly the defects form and ultimately to understand how to prevent their formation by adjusting the diamond deposition reactor input variables to prevent/reduce their formation.

(6) Having knowledge that the center of the substrate is slightly higher than the edges of the substrate which is often a preferred diamond deposition strategy. The input variables can be adjusted to obtain such a growth condition.

(7) Having knowledge of how much the substrate may be growing laterally over the edge of the substrate.

The use of feedback control is important for the deposition of thick layers of diamond because, as the diamond grows, its top surface grows up closer to the plasma discharge. Also, the position of the top growth surface of the substrate that is sitting in the pocket recess relative to the top surface of the substrate holder is changing. So, as the diamond is deposited the local environment of the deposition changes. This dynamic changing of the growth conditions occurs on the order of hours for thick layer deposition. Thick layer deposition can be defined as being on the order of hundreds of micrometers to a few millimeters (e.g., about 0.1 mm or 0.5 mm to about 1 mm or 3 mm). Using feedback from the disclosed light reflection/scattering method to adjust the local deposition environment as the diamond grows. This can be done in coordination with measurement of the substrate temperature.

EXAMPLES

The following examples illustrate the disclosed apparatus and methods, but are not intended to limit the scope of any claims thereto.

Example 1

Figure 6:
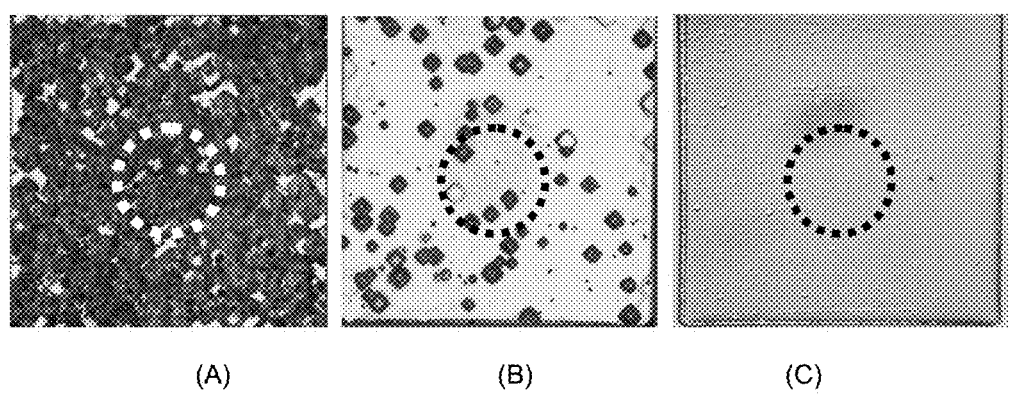
FIG. 6 includes photographs illustrating diamond deposition substrate states for three different substrate temperatures of 920° C. (panel A), 870° C. (panel B), and 815° C. (panel C). The other deposition conditions include 3.75% methane, 170 Torr and low boron levels in the feed gas of [B/C]=0-5 ppm. Each substrate pictured is 3.5 mm×3.5 mm.

As illustrated in the photographs of FIG. 6, diamond was deposited on a substrate user a microwave cavity plasma reactor as generally described herein at three different substrate temperatures of 920° C. (panel A), 870° C. (panel B), and 815° C. (panel C). The other deposition conditions include 3.75% methane, 170 Torr and low boron levels in the feed gas of [B/C]=0–5 ppm. Each substrate pictured is 3.5 mm×3.5 mm.

The circular overlay in each panel correspond to an approximate 1 mm-diameter hypothetical incident laser beam interrogation area from which reflected and scattered light could be measured according to the disclosure. In panel A, the very rough surface exhibits protrusions across essentially the entire interrogation area, which would result in a large degree of scattering in the light measured at the detector (e.g., focal plane array or otherwise). In panel C, the very smooth surface is essentially flat across the entire interrogation area, which would result in a low degree of scattering in the light measured at the detector. In panel B, the representative interrogation area includes a combination of very smooth and flat regions (which result in a low degree of scattering) and very rough regions (which result in a high degree of scattering), with the composite result over the interrogation area illustrating a degree of scattering between the cases in panels A and C. If the surface properties were measured in real time during deposition (e.g., in combination with local substrate surface temperatures), measurement and detection of high or intermediate degrees of scattering such as would be observed in panels A or B, respectively, could be used in a real-time feedback loop in which the deposition temperature is adjusted (e.g., lowered in this case) during deposition in an attempt to reduce surface roughness and potentially recover a smooth top substrate surface.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compositions, processes, kits, or apparatus are described as including components, steps, or materials, it is contemplated that the compositions, processes, or apparatus can also comprise, consist essentially of, or consist of, any combination of the recited components or materials, unless described otherwise. Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure.

What is claimed is:

1. A microwave plasma assisted reactor system comprising:
   a microwave plasma assisted reactor comprising:
   (a) a first microwave chamber having an internal volume and comprising an electromagnetic wave source;
   (b) a plasma chamber having an outer wall and comprising an optical window forming at least a portion of the outer wall, the plasma chamber extending into the first microwave chamber;
   (c) a stage for supporting a substrate, the stage having a reference surface extending into the plasma chamber;
   (d) a first electrically conductive, optically transparent region forming at least a portion of the first microwave chamber external boundary; and
   (e) a second electrically conductive, optically transparent region forming at least a portion of the first microwave chamber external boundary;
   wherein:
      the first region and the second region are spatially positioned such that, when a substrate is present on the stage reference surface, light from a coherent light source passing through the first region is in optical communication with the second region by (i) passing through the first region, (ii) passing through the optical window of the plasma chamber, (iii) reflecting off the substrate, (iv) passing through the optical window of the plasma chamber, and (v) passing through the second region; and the light from the coherent light source maintains its coherency when passing through the first region, through the optical window of the plasma chamber, and through the second region;
   a coherent light source positioned and adapted to direct the incident beam of coherent light through the first region and into the first microwave chamber internal volume;
   a means for detecting a spatial distribution of incident light energy positioned to receive an incident distribution of light that has been reflected and/or scattered from the reflected beam of coherent light by a substrate present on the stage reference surface, when present; and
   wherein the microwave plasma assisted reactor system further comprises: (f) a computer comprising a processor and memory coupled to a non-transitory computer readable storage medium encoded with a computer program, the program comprising instructions that, when executed by the processor, cause the computer to control the steerable mirror, the coherent light source, and the means for detecting a spatial distribution of incident light energy during operation of the microwave plasma assisted reactor;
      wherein the computer program further comprises instructions that, when executed by the processor, cause the computer to: determine an average local surface angle, a local surface roughness, and a local surface curvature of a substrate during operation of the microwave plasma assisted reactor; and
   perform one or more of issuing an alert, halting deposition, and altering deposition conditions in a feedback control loop based on one or more of the average local surface angle, the local surface roughness, and the local surface curvature.

2. The microwave plasma assisted reactor system of claim 1, wherein:
   the first electrically conductive, optically transparent region comprises a first metallic screen, and
   the second electrically conductive, optically transparent region comprises a second metallic screen.

3. The microwave plasma assisted reactor system of claim 1, wherein:
   the first electrically conductive, optically transparent region comprises a first electrically conducting optical window, and
   the second electrically conductive, optically transparent region comprises a second electrically conducting optical window.

4. The microwave plasma assisted reactor system of claim 1, wherein the first region and the second region are separate regions of the first microwave chamber external boundary.

5. The microwave plasma assisted reactor system of claim 1, wherein the first region and the second region are portions of the same region of the first microwave chamber external boundary.

6. The microwave plasma assisted reactor system of claim 1, wherein the first region and the second region are each positioned on an outer wall of the first microwave chamber.

7. The microwave plasma assisted reactor system of claim 1, wherein the first microwave chamber further comprises an upper conducting short in electrical contact with an outer wall of the first microwave chamber and disposed in an upper portion of the first microwave chamber, the upper conducting short defining an upper boundary of the first microwave chamber.

8. The microwave plasma assisted reactor system of claim 7, wherein the first region and the second region are each positioned on the upper conducting short.

9. The microwave plasma assisted reactor system of claim 7, wherein the first region is positioned on an outer wall of the first microwave chamber, and the second region is each positioned on the upper conducting short.

10. The microwave plasma assisted reactor system of claim 1, wherein the optical window comprises two opposing flat external surfaces.

11. The microwave plasma assisted reactor system of claim 1, wherein:
the optical window comprises a first optical window region and a second optical window region;
the first optical window region is positioned such that coherent light passing through the first region and to the substrate, when present, also passes through the first optical window region, and
the second optical window region is positioned such that light reflecting off the substrate, when present, and passing through the second region also passes through the second optical window.

12. The microwave plasma assisted reactor system of claim 1, wherein:
the first microwave chamber has a reference plane at a reference axial location $Z_0$, the first microwave chamber extends in an axial direction $z>Z_0$, and the upper conducting short is disposed in an upper portion of the first microwave chamber at an axial distance $Z_s$, above $Z_0$, the upper conducting short having a central opening,
the plasma chamber extends into the first microwave chamber such that at least a portion of the plasma chamber is located at $z>Z_0$, and
the stage is a conductive stage and has an axially adjustable reference surface extending into the plasma chamber at an axial distance $Z_s$, relative to $Z_0$.

13. The microwave plasma assisted reactor system of claim of claim 12, wherein
the conductive stage defines a second microwave chamber in the plasma chamber at $z<Z_0$ and between the plasma chamber outer wall and the conductive stage;
the microwave plasma assisted reactor further comprises a conducting short adjustably disposed in the second microwave chamber below $Z_0$ and in electrical contact with the plasma chamber outer wall and the conductive stage, the axial distance between the conducting short and $Z_0$ being L2, and the axial distance between the conducting short and the reference surface of the conductive stage being L1; and
L2 and L1 are capable of axial adjustment in the reactor by moving the conducting short during operation of the reactor.

14. The microwave plasma assisted reactor system of claim 1, further comprising a steerable mirror positioned to receive an incident beam of coherent light external to the reactor and to direct a reflected beam of the coherent light through the first region and into the first microwave chamber internal volume,
wherein the coherent light source is positioned and adapted to direct the incident beam of coherent light to the steerable mirror, through the first region and into the first microwave chamber internal volume.

15. The microwave plasma assisted reactor system of claim 1, wherein the means for detecting a spatial distribution of incident light energy comprises a focal plane array.

16. The microwave plasma assisted reactor system of claim 1, wherein at least one of the first electrically conductive, optically transparent region and the second electrically conductive, optically transparent region comprises an electrically conductive material selected from group consisting of transparent metal oxides, graphites, conductive polymers, and combinations thereof.

17. The microwave plasma assisted reactor system of claim 1, wherein at least one of the first electrically conductive, optically transparent region and the second electrically conductive, optically transparent region comprises an optical window and an electrically conductive transparent film on the optical window.

18. The microwave plasma assisted reactor system of claim 1, wherein the first electrically conductive, optically transparent region and the second electrically conductive, optically transparent region are adapted to confine microwaves within the microwave chamber such that the microwave chamber as a whole confines microwaves within a resonant cavity of the microwave chamber.

19. The microwave plasma assisted reactor system of claim 1, wherein the means for detecting a spatial distribution of incident light energy is positioned at or withing 1 cm of the second electrically conductive, optically transparent region.

20. The microwave plasma assisted reactor system of claim 19, wherein the means for detecting a spatial distribution of incident light energy has a lateral dimension in a range of 25 mm to 40 mm for receiving scattered and/or reflected light.

21. The microwave plasma assisted reactor system of claim 20, further comprising an optical band pass filter positioned between the means for detecting a spatial distribution of incident light energy and the second electrically conductive, optically transparent region.

* * * * *